(12) United States Patent
Lee et al.

(10) Patent No.: US 9,852,965 B2
(45) Date of Patent: Dec. 26, 2017

(54) SEMICONDUCTOR DEVICES WITH THROUGH ELECTRODES AND METHODS OF FABRICATING THE SAME

(71) Applicants: Ho-Jin Lee, Seoul (KR); Byung Lyul Park, Seoul (KR); Kwangjin Moon, Hwaseong-si (KR); Jisoon Park, Suwon-si (KR); Jin Ho An, Seoul (KR)

(72) Inventors: Ho-Jin Lee, Seoul (KR); Byung Lyul Park, Seoul (KR); Kwangjin Moon, Hwaseong-si (KR); Jisoon Park, Suwon-si (KR); Jin Ho An, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/204,632

(22) Filed: Jul. 7, 2016

(65) Prior Publication Data
US 2017/0047270 A1    Feb. 16, 2017

(30) Foreign Application Priority Data
Aug. 13, 2015   (KR) ......................... 10-2015-0114833

(51) Int. Cl.
*H01L 23/48*   (2006.01)
*H01L 21/768*  (2006.01)

(52) U.S. Cl.
CPC ...... *H01L 23/481* (2013.01); *H01L 21/76898* (2013.01); *H01L 2224/11* (2013.01); *H01L 2224/16145* (2013.01); *H01L 2924/181* (2013.01)

(58) Field of Classification Search
CPC ........................ H01L 23/481; H01L 21/76898
See application file for complete search history.

(56) References Cited

U.S. PATENT DOCUMENTS

| | | | |
|---|---|---|---|
| 7,777,345 B2 | 8/2010 | Lee et al. | |
| 7,786,584 B2 | 8/2010 | Barth et al. | |
| 8,004,090 B2 | 8/2011 | Uchiyama | |
| 8,166,651 B2 | 5/2012 | Lindgren et al. | |

(Continued)

FOREIGN PATENT DOCUMENTS

| | | |
|---|---|---|
| KR | 10-0817078 | 3/2008 |
| KR | 10-0843211 | 6/2008 |

(Continued)

*Primary Examiner* — Roy Potter
*Assistant Examiner* — Paul Patton
(74) *Attorney, Agent, or Firm* — Myers Bigel, P.A.

(57) ABSTRACT

Provided herein are semiconductor devices with through electrodes and methods of fabricating the same. The methods may include providing a semiconductor substrate having top and bottom surfaces facing each other, forming on the top surface of the semiconductor substrate a main via having a hollow cylindrical structure and a metal line connected to the main via, forming an interlayered insulating layer on the top surface of the semiconductor substrate to cover the main via and the metal line, removing a portion of the semiconductor substrate to form a via hole exposing a portion of a bottom surface of the main via, and forming in the via hole a through electrode that is electrically connected to the main via. The bottom surface of the main via is overlapped by a circumference of the via hole, when viewed in a plan view.

20 Claims, 24 Drawing Sheets

(56) References Cited

U.S. PATENT DOCUMENTS

| | | |
|---|---|---|
| 8,338,939 B2 | 12/2012 | Lin et al. |
| 8,390,120 B2 | 3/2013 | Moon et al. |
| 8,405,115 B2 | 3/2013 | Samoilov et al. |
| 8,466,062 B2 | 6/2013 | Lu et al. |
| 8,614,145 B2 | 12/2013 | Hummler |
| 8,772,946 B2 | 7/2014 | Uzoh et al. |
| 8,809,188 B2 | 8/2014 | Tezcan et al. |
| 8,907,493 B2 | 12/2014 | Uchida et al. |
| 9,035,460 B2 | 5/2015 | Matsuura |
| 9,171,753 B2 | 10/2015 | Lee et al. |
| 9,177,914 B2 | 11/2015 | Tseng et al. |
| 2008/0122116 A1 | 5/2008 | Park et al. |
| 2008/0128888 A1 | 6/2008 | Park et al. |
| 2011/0254165 A1 | 10/2011 | Muranaka |
| 2012/0315758 A1 | 12/2012 | Sakurai et al. |
| 2013/0015504 A1 | 1/2013 | Kuo et al. |
| 2013/0093042 A1 | 4/2013 | Lin et al. |
| 2013/0256910 A1 | 10/2013 | Lee et al. |
| 2013/0270670 A1 | 10/2013 | Yang et al. |
| 2014/0048952 A1 | 2/2014 | Lee et al. |
| 2014/0065729 A1 | 3/2014 | Cho |
| 2014/0363968 A1 | 12/2014 | Yang |
| 2015/0108605 A1* | 4/2015 | Park .................. H01L 27/10817 257/532 |

FOREIGN PATENT DOCUMENTS

| | | |
|---|---|---|
| KR | 10-0881199 | 1/2009 |
| KR | 10-2013-0093961 | 8/2013 |
| KR | 10-2014-0024674 | 3/2014 |

\* cited by examiner (COMPARATIVE EXAMPLE)

(COMPARATIVE EXAMPLE)

(COMPARATIVE EXAMPLE)

(COMPARATIVE EXAMPLE)

SEMICONDUCTOR DEVICES WITH THROUGH ELECTRODES AND METHODS OF FABRICATING THE SAME

RELATED APPLICATIONS

This U.S. non-provisional patent application claims the benefit of and priority under 35 U.S.C. §119 to Korean Patent Application No. 10-2015-0114833, filed on Aug. 13, 2015, in the Korean Intellectual Property Office, the entire contents of which are hereby incorporated by reference.

FIELD

The present inventive concepts relate to semiconductor devices, and in particular, to semiconductor devices with through electrodes and methods of fabricating the same.

BACKGROUND

In order to electrically connect a semiconductor device to another semiconductor device or a printed circuit board, a method of forming a through electrode passing through a substrate may be used. The use of a through electrode makes it possible to realize a three-dimensionally stacked package structure and to obtain an increased data-transfer speed compared to a conventional package structure using solder balls or solder bumps. Methods of reliably forming a through electrode may be desirable.

SUMMARY

Example embodiments of the present inventive concepts provide semiconductor devices in which through electrodes with improved electric characteristics may be provided, and methods of fabricating the same.

In some example embodiments of the present inventive concepts, semiconductor devices with through electrodes and methods of forming the through electrodes with high yield may be provided.

According to example embodiments of the present inventive concepts, a semiconductor device with a through electrode and a method of fabricating the same may be provided, and, in some embodiments, a connection via may be formed between the through electrode and a metal line.

According to example embodiments of the present inventive concepts, it may be possible to prevent plasma charges from being accumulated in an insulating layer.

According to example embodiments of the present inventive concepts, it may be possible to prevent a notch from being formed and thereby to prevent a short circuit from being formed between a through electrode and a semiconductor substrate.

According to example embodiments of the present inventive concepts, a semiconductor device may include a substrate having top and bottom surfaces facing each other; a through electrode passing through the substrate and extending from the top surface to the bottom surface; an interconnection line provided on the top surface of the substrate, and a first via provided between the through electrode and the interconnection line that electrically connects the through electrode to the interconnection line. The first via may be a ring-shaped structure and at least a portion of the first via may extend at a circumference of the through electrode.

In some embodiments, the substrate may be provided having a via hole that is at least partially filled with the through electrode, the via hole may have an inner surface defining an interface between the substrate and the through electrode, the first via may have a top surface adjacent to the interconnection line and a bottom surface adjacent to the through electrode, and the bottom surface of the first via may overlap the inner surface of the via hole.

In some embodiments, the through electrode may extend beyond the top surface of the substrate to fill an internal space at least partially defined by the first via.

In some embodiments, the semiconductor device may further include a second via provided inside an area defined by the first via. The second via may electrically connect the through electrode to the interconnection line.

In some embodiments, the second via may be a pillar-shaped structure that extends between the interconnection line and the through electrode.

In some embodiments, the second via may be a ring-shaped structure that extends between the interconnection line and the through electrode, and at least a portion of the second via may extend at a circumference of the through electrode.

In some embodiments, the through electrode may have a top surface facing the interconnection line, and the top surface of the through electrode may have an uneven shape.

In some embodiments, the through electrode may be extended beyond the top surface of the substrate to fill a space between the first via and the second via.

In some embodiments, the semiconductor device may further include a third via provided outside the first via and electrically connected to the interconnection line.

In some embodiments, the third via may be a ring-shaped structure that is between the substrate and the interconnection line and encloses the first via.

In some embodiments, the third via may be a circular-pillar-shaped structure that is between the substrate and the interconnection line.

According to example embodiments of the present inventive concepts, a semiconductor device may include a semiconductor substrate having top and bottom surfaces facing each other; a metal line provided on the top surface of the semiconductor substrate, a via hole vertically penetrating the semiconductor substrate and extending from the top surface to the bottom surface, a through electrode that fills at least a portion of the via hole and is electrically connected to the metal line, and a first via provided on the top surface of the semiconductor substrate, wherein the first via is vertically provided between the metal line and the through electrode, is electrically connected to the through electrode, has a ring-shaped cylindrical structure, and at least a portion of the first via extends at a circumference of the via hole.

In some embodiments, the via hole may have an inner surface that is overlapped by the first via, when viewed in a plan view.

In some embodiments, the semiconductor device may further include at least one of second and third vias. The second via may be provided in an inner empty space of the first via and may be electrically connected to the through electrode, and the third via may be provided outside the first via and may be electrically connected to the metal line.

In some embodiments, the at least one of the second and third vias may be provided between the metal line and the semiconductor substrate and may have a hollow ring-shaped cylindrical structure, and at least a portion of the hollow ring-shaped cylindrical structure may vertically extend at the circumference of the via hole.

In some embodiments, the at least one of the second and third vias may be a pillar-shaped structure that vertically extends from the metal line to the semiconductor substrate.

According to example embodiments of the present inventive concepts, a semiconductor device may include a semiconductor substrate having electrically active and electrically inactive surfaces facing each other, an interlayered insulating layer provided on the electrically active surface of the semiconductor substrate, a metal line provided in the interlayered insulating layer, a via hole vertically penetrating the semiconductor substrate from the electrically active surface to the electrically inactive surface, a through electrode filling the via hole and vertically extending from the electrically active surface to the electrically inactive surface, and a main via provided in the interlayered insulating layer that electrically connects the through electrode to the metal line. The main via may have a hollow ring-shaped cylindrical structure that vertically extends from the metal line to the through electrode and at least a portion of the main via may be at a circumference of the via hole and may be overlapped with at least a portion of the via hole, when viewed in a plan view.

In some embodiments, the semiconductor device may further include an auxiliary via that is provided in an empty space of the main via or outside the main via and is electrically connected to the metal line.

In some embodiments, the through electrode may extend into a region between the auxiliary via and the main via and may extend beyond the electrically active surface of the semiconductor substrate.

In some embodiments, the through electrode may extend into the main via beyond the electrically active surface of the semiconductor substrate.

According to example embodiments of the present inventive concepts, a method of fabricating a semiconductor device may include providing a semiconductor substrate having top and bottom surfaces facing each other, forming on the top surface of the semiconductor substrate a first via having a hollow cylindrical structure and a metal line connected to the first via, removing a portion of the semiconductor substrate to form a via hole, wherein an inner surface of the via hole may be overlapped by a bottom surface of the first via, and the bottom surface of the first via may be adjacent to the top surface of the semiconductor substrate, and forming in the via hole a through electrode that is electrically connected to the first via. The first via may be overlap a portion of the via hole.

In some embodiments, the method may further include, before removing the portion of the semiconductor substrate to form the via hole, recessing the bottom surface of the semiconductor substrate.

In some embodiments, the method may further include forming a second via in an inner empty space of the first via.

In some embodiments, the second via may have a hollow ring-shaped cylindrical structure, may be provided between the metal line and the semiconductor substrate, and may extend at a circumference of the via hole provided between the metal line and the semiconductor substrate. The second via may have a vertically extending pillar-shaped structure and may be provided between the metal line and the semiconductor substrate.

In some embodiments, the method may further include forming an interlayered insulating layer on the top surface of the semiconductor substrate to cover the first and second vias.

In some embodiments, removing the portion of the semiconductor substrate to form the via hole may further include removing the interlayered insulating layer from a region between the first and second vias and the through electrode may extend into the region between the first and second vias.

In some embodiments, the method may further include forming a third via outside the first via. The third via may be electrically connected to the metal line.

In some embodiments, the third via may have a hollow ring-shaped cylindrical structure, may be provided between the metal line and the semiconductor substrate, and may extend at a circumference of the via hole provided between the metal line and the semiconductor substrate. The third via may have a vertically extending pillar-shaped structure and may be provided between the metal line and the semiconductor substrate.

In some embodiments, the method may further include forming an interlayered insulating layer on the top surface of the semiconductor substrate to cover the first via.

In some embodiments, removing the portion of the substrate to form the via hole may further include removing the interlayered insulating layer from an inner space of the first via, and the through electrode may extend into the inner space of the first via.

According to example embodiments of the present inventive concepts, a method of fabricating a semiconductor device may include providing a semiconductor substrate having top and bottom surfaces facing each other, forming on the top surface of the semiconductor substrate a metal line having a hollow cylindrical structure and a metal line connected to the main via, forming an interlayered insulating layer on the top surface of the semiconductor substrate to cover the main via and the metal line, removing a portion of the semiconductor substrate to form a via hole exposing a portion of a bottom surface of the main via, and forming in the via hole a through electrode that is electrically connected to the main via. The bottom surface of the main via may overlap with a circumference of the via hole, when viewed in a plan view.

In some embodiments, removing the portion of the semiconductor substrate to form the via hole may include performing a plasma etching process to selectively remove a portion of the semiconductor substrate positioned below an inner empty space of the main via.

In some embodiments, removing the portion of the semiconductor substrate to form the via hole may further include removing a portion of the interlayered insulating layer formed in an inner space of the main via, and the through electrode may be formed to include a portion extending into the main via.

In some embodiments, the method may further include forming an auxiliary via on the top surface of the semiconductor substrate. The auxiliary via may be provided in an inner empty space of the main via and may be connected to the metal line.

In some embodiments, removing the portion of the semiconductor substrate to form the via hole may further include removing the interlayered insulating layer from a region between the main via and the auxiliary via, and in this case, the through electrode may be formed to include a portion extending into the region between the main via and the auxiliary via.

In some embodiments, the method may further include forming an auxiliary via that is provided outside the main via and is connected to the metal line and the semiconductor substrate.

According to example embodiments of the present inventive concepts, a method of fabricating a semiconductor device may include providing a semiconductor substrate having electrically active and electrically inactive surfaces facing each other, forming on the electrically active surface of the semiconductor substrate a via having a hollow cylindrical structure and a metal line connected to the via, recessing the electrically inactive surface of the semiconductor substrate to provide a recessed electrically inactive surface of the semiconductor substrate, performing a plasma etching process on the recessed electrically inactive surface of the semiconductor substrate to form a via hole penetrating the semiconductor substrate and exposing a portion of a bottom surface of the via, and forming in the via hole a through electrode that is electrically connected to the via. The via may be used as a plasma charge and/or plasma ion conduction pathway that allows plasma charges and/or plasma ions generated in the plasma etching process to pass therethrough.

In some embodiments, the method may further include forming at least one of a first auxiliary via and a second auxiliary via on the electrically active surface of the semiconductor substrate. Here, the first auxiliary via may be provided in an inner empty space of the via and may be connected to the metal line, and the second auxiliary via may be provided outside the via and may be connected to the metal line.

In some embodiments, at least one of the first and second auxiliary vias may have one of a hollow cylindrical structure and a pillar-shape structure extending from the metal line to the semiconductor substrate.

In some embodiments, the first auxiliary via may be formed between the metal line and the through electrode, and the second auxiliary via may be formed between the metal line and the semiconductor substrate.

According to example embodiments of the present inventive concepts, a semiconductor device may include: a substrate having top and bottom surfaces that face each other; a through electrode that vertically extends through the substrate from the top surface to the bottom surface and, in a horizontal plane, the through electrode has a first perimeter; and a first via on the top surface of the substrate, the first via having an inner perimeter and an outer perimeter in the horizontal plane, wherein the outer perimeter of the first via is greater than and surrounds the first perimeter of the through electrode.

In some embodiments, the inner perimeter of the first via may be greater than or equal to the first perimeter of the through electrode and optionally the inner perimeter of the first via may surround the first perimeter of the through electrode. In some embodiments, the inner perimeter of the first via may be less than the first perimeter of the through electrode and the first perimeter of the through electrode may surround the inner perimeter of the first via.

In some embodiments, the substrate includes an inner surface that vertically extends through the substrate from the top surface to the bottom surface, and the inner surface, in the horizontal plane, has a second perimeter. The outer perimeter of the first via may be greater than and surround the second perimeter, the inner perimeter of the first via may be less than the second perimeter, and the second perimeter may surround the inner perimeter.

In some embodiments, the first via may have a hollow cylindrical shape.

In some embodiments, the semiconductor device may further include a second via on the top surface of the substrate and in an area surrounded by the outer and inner perimeters of the first via.

In some embodiments, the through electrode may extend vertically above the top surface of the substrate and along at least a portion of the first via.

In some embodiments, the through electrode may extend vertically above the top surface of the substrate, along at least a portion of the first via, and along at least a portion of the second via.

In some embodiments, the semiconductor device may further include a metal line on the top surface of the substrate, and the through electrode may extend vertically to the metal line.

In some embodiments, the semiconductor device may further include a third via on the top surface of the substrate, wherein, in the horizontal plane, the third via is outside the outer perimeter of the first via.

According to example embodiments of the present inventive concepts, a semiconductor device may include: a substrate having top and bottom surfaces that face each other; a through electrode that vertically extends through the substrate from the top surface to the bottom surface and between interior opposing sidewalls of the substrate; and a first via on the top surface of the substrate, wherein at least a portion of the first via overlaps the interior opposing sidewalls of the substrate.

In some embodiments, at least a portion of the first via may extend at a circumference of the through electrode.

In some embodiments, the first via may have a hollow cylindrical shape.

In some embodiments, the semiconductor device may further include a second via on the top surface of the substrate and between the opposing sidewalls of the substrate.

In some embodiments, the through electrode may extend vertically above the top surface of the substrate and along at least a portion of the first via.

In some embodiments, the semiconductor device may further include a metal line on the top surface of the substrate, wherein the through electrode extends vertically to the metal line.

In some embodiments, the semiconductor device may further include a third via on the top surface of the substrate, wherein, in the horizontal plane, the third via may surround the first via.

According to example embodiments of the present inventive concepts, a method of forming a semiconductor device may include: providing a substrate having top and bottom surfaces that face each other, wherein the substrate includes a first via on the top surface of the substrate; forming a via hole in the substrate, wherein the via hole vertically extends through the substrate from the top surface to the bottom surface, forms an interior surface in the substrate, and exposes at least a portion of a bottom surface of the first via to provide an exposed bottom surface of the first via; and forming a through electrode in the via hole, wherein the through electrode is electrically connected to the first via, wherein the exposed bottom surface of the first via overlaps the interior surface of substrate formed by the via hole.

In some embodiments, the first via may have a hollow cylindrical shape.

In some embodiments, the method may further include forming a second via on the top surface of the substrate, wherein the first via defines an interior area and the second via is in the interior area.

In some embodiments, the through electrode may extend vertically above the top surface of the substrate and along at least a portion of the first via.

In some embodiments, the substrate may further include a metal line on the top surface of the substrate, and the through electrode extends vertically to the metal line.

In some embodiments, the method may further include forming a third via on the top surface of the substrate, wherein, in the horizontal plane, the third via surrounds the first via.

BRIEF DESCRIPTION OF THE DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

Figure 1:
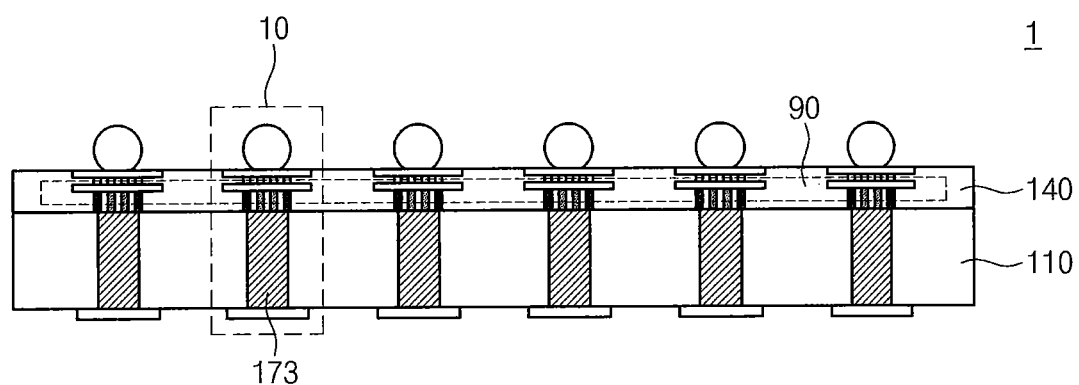
FIG. 1 is a sectional view illustrating a semiconductor device according to an example embodiment of the present inventive concepts.

It should be noted that these figures are intended to illustrate the general characteristics of methods, structures and/or materials utilized in certain example embodiments of the present inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments are described below with reference to the accompanying drawings, in which some example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the disclosure.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of disclosure to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these present inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a sectional view illustrating a semiconductor device according to an example embodiment of the present inventive concepts.

Referring to FIG. 1, a semiconductor device 1 may include an integrated circuit 90 provided on a semiconductor substrate 110, an interlayered insulating layer 140 covering the integrated circuit 90, and one or more electric connection structures 10 electrically connected to the integrated circuit 90. Each of the electric connection structures 10 may include a through electrode 173, which is formed to vertically pass through the semiconductor substrate 110 and serves as a signal path for transmitting electrical signals. Each of the electric connection structures 10 may be electrically connected to the integrated circuit 90.

As another example, at least one of the electric connection structures 10 may be electrically disconnected to the integrated circuit 90. In the case where the electric connection structure 10 is electrically disconnected from the integrated circuit 90, it may serve as electric connection paths, allowing electric signals to be transmitted between electric devices (e.g., semiconductor devices, semiconductor modules, and/or circuit boards) disposed on or under the semiconductor device 1. Hereinafter, various examples of the electric connection structure 10 will be described.

Figure 2A:
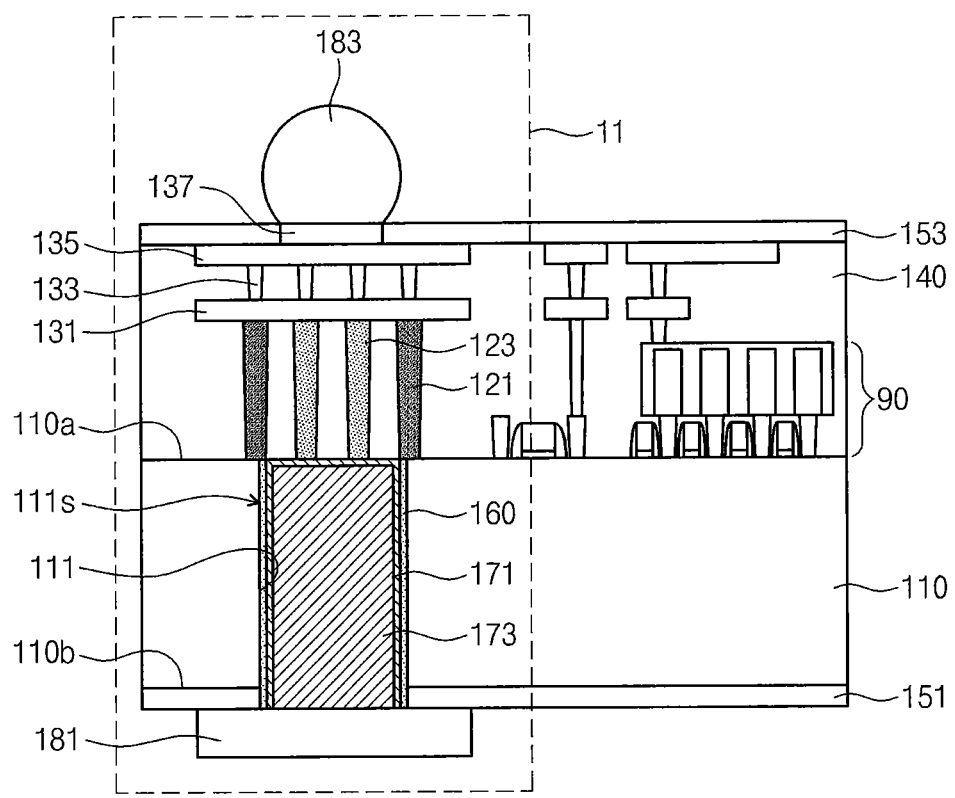
FIG. 2A is an enlarged sectional view illustrating a portion of FIG. 1 according to an example embodiment of the present inventive concepts.
Figure 2B:
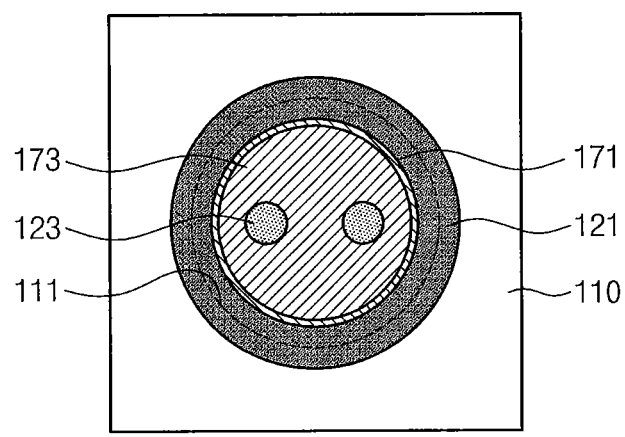
FIGS. 2B through 2D are plan views illustrating a portion of FIG. 2A.
Figure 2C:
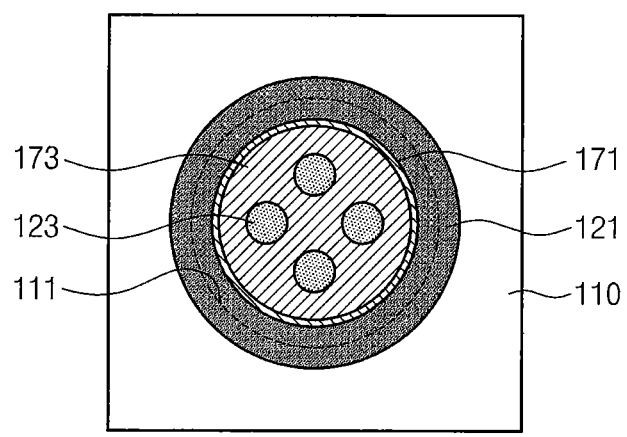
Figure 2D:
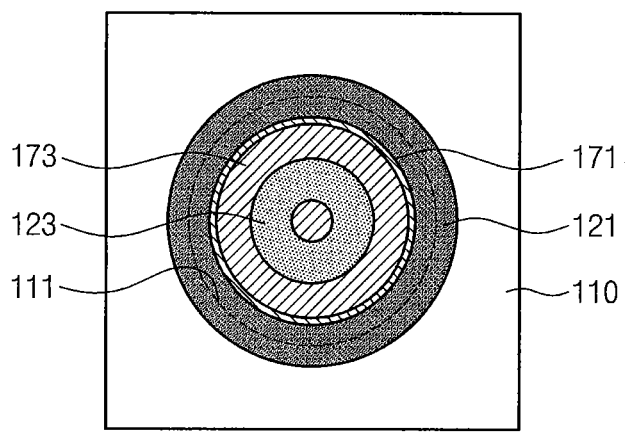

FIG. 2A is an enlarged sectional view illustrating a portion of FIG. 1 according to an example embodiment of the present inventive concepts. FIGS. 2B through 2D are plan views illustrating a portion of FIG. 2A.

Referring to FIG. 2A, a vertical connection structure 11, one of the electric connection structures 10 of FIG. 1, may include the semiconductor substrate 110 with an active surface 110a and an inactive surface 110b, the through electrode 173 filling a via hole 111 vertically penetrating the semiconductor substrate 110, a first metal line 131 electrically connected to the integrated circuit 90 provided on the active surface 110a of the semiconductor substrate 110, and connection plugs or connection vias 121, 123 provided between the through electrode 173 and the first metal line 131 to electrically connect the through electrode 173 to the first metal line 131. The through electrode 173 may be provided around or in the integrated circuit 90. The semiconductor substrate 110 may include a silicon substrate that is provided in the form of a wafer or chip. The integrated circuit 90 may include a memory circuit, a logic circuit, or any combination thereof.

The vertical connection structure 11 may further include a lower terminal 181 and/or an upper terminal 183 electrically connected to the through electrode 173. The lower terminal 181 may include a pad, and the upper terminal 183 may include a solder ball. A second metal line 135 may be further provided on the first metal line 131, and the first metal line 131 and the second metal line 135 may be electrically connected to each other through at least one via 133. In some embodiments, the upper terminal 183 may be provided on the interlayered insulating layer 140 and may be connected to a pad 137 connected to the second metal line 135. An upper protection layer 153 may be provided to cover the interlayered insulating layer 140, and a lower protection layer 151 may be provided to cover the inactive surface 110b of the semiconductor substrate 110.

Referring to FIGS. 2A and 2B, the through electrode 173 may be provided to have, for example, a circular pillar shape. The vertical connection structure 11 may further include a via insulating layer 160 that is provided on an inner surface 111s of the via hole 111 to surround a side surface of the through electrode 173. The via insulating layer 160 may electrically isolate the through electrode 173 from the semiconductor substrate 110. The via insulating layer 160 may extend from the active surface 110a of the semiconductor substrate 110 to a bottom surface of the lower protection layer 151. Alternatively, the via insulating layer 160 may extend from the active surface 110a of the semiconductor substrate 110 to the inactive surface 110b. The vertical connection structure 11 may further include a barrier layer 171, which is provided to cover side and top surfaces of the through electrode 173. The barrier layer 171 may prevent constituents (e.g., copper) of the through electrode 173 from being moved and/or diffused into the semiconductor substrate 110 and/or the integrated circuit 90.

The connection plugs or connection vias 121, 123 (referred to hereinafter as connection vias) may include a first via 121, which is positioned adjacent to an outer circumference of the through electrode 173, and at least one second via 123, which is positioned adjacent to a center of the through electrode 173. When viewed in a plan view as shown in FIG. 2B, the first via 121 may be a ring-shaped structure extending along the outer circumference of the through electrode 173. For example, the first via 121 may have a hollow cylindrical shape. In some embodiments, the first via 121 may be overlapped with the inner surface 111s of the via hole 111. Accordingly, the inner surface 111s of the via hole 111 (or an interface between the via hole 111 and the via insulating layer 160) may be connected to a bottom surface of the first via 121.

The second via 123 may be provided in an inner space of the first via 121. As shown in FIG. 2A, the second via 123 may be provided between the first metal line 131 and the semiconductor substrate 110 to have a vertically-extending circular pillar shape, and when viewed in a plan view, it may be overlapped with the through electrode 173. In some embodiments, a plurality of second vias 123 may be located on an imaginary line passing through a center of the through electrode 173 or the via hole 111, as shown in FIG. 2B. In some embodiments, a plurality of the second vias 123 may be disposed on the through electrode 173 to form a grid or mesh-shape arrangement, as shown in FIG. 2C. In some embodiments, the second via 123 may have a hollow cylindrical shape similar to the first via 121, as shown in FIG. 2D.

The through electrode 173 may be provided to have a substantially flat top surface. In some embodiments, the through electrode 173 may be provided to have an uneven top surface, as will be described with reference to the vertical connection structure 11a of FIG. 9B.

Figure 3A:
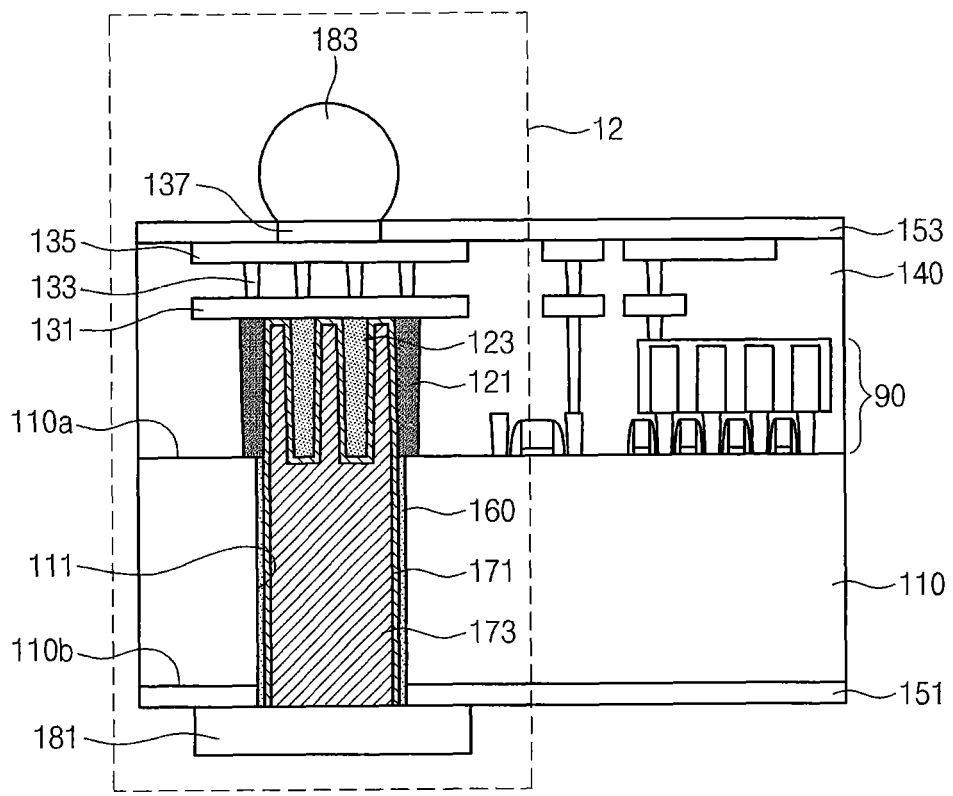
FIG. 3A is a sectional view illustrating a portion of FIG. 1 according to an example embodiment of the present inventive concepts.
Figure 3B:
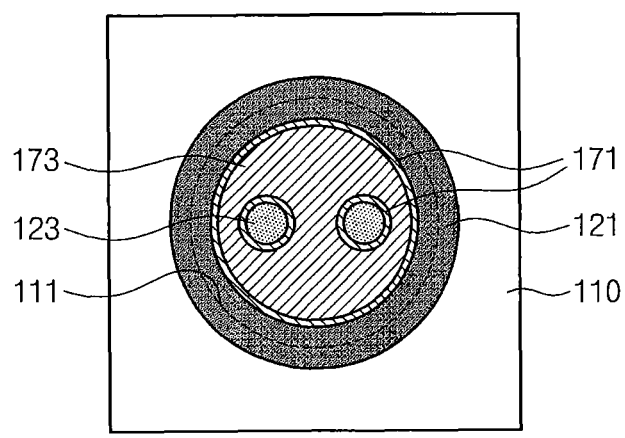
FIG. 3B is a plan view illustrating a portion of FIG. 3A.

FIG. 3A is a sectional view illustrating a portion of FIG. 1 according to an example embodiment of the present inventive concepts. FIG. 3B is a plan view illustrating a portion of FIG. 3A.

Referring to FIGS. 3A and 3B, a vertical connection structure 12, one of the electric connection structures 10 of FIG. 1, may have a structure similar to the vertical connection structure 11 of FIG. 2A. The through electrode 173 may have a protruding structure extended to the first metal line 131 beyond the active surface 110a of the semiconductor substrate 110. For example, the vertical connection structure 12 may be configured in such a way that the through electrode 173 is extended into gaps between the connection vias 121 and 123 or that the second vias 123 are inserted into an upper recessed region of the through electrode 173. This may make it possible to increase a contact area between the through electrode 173 and the connection vias 121 and 123. In embodiments where the barrier layer 171 is provided, the barrier layer 171 may be disposed to enclose not only the through electrode 173 but also the connection vias 123.

The first and second vias 121 and 123 may be provided to have substantially the same vertical length. In some embodiments, the first and second vias 121 and 123 of the vertical connection structure 12a may be provided to have different vertical lengths, as will be described with reference to FIG. 11B.

Figure 4A:
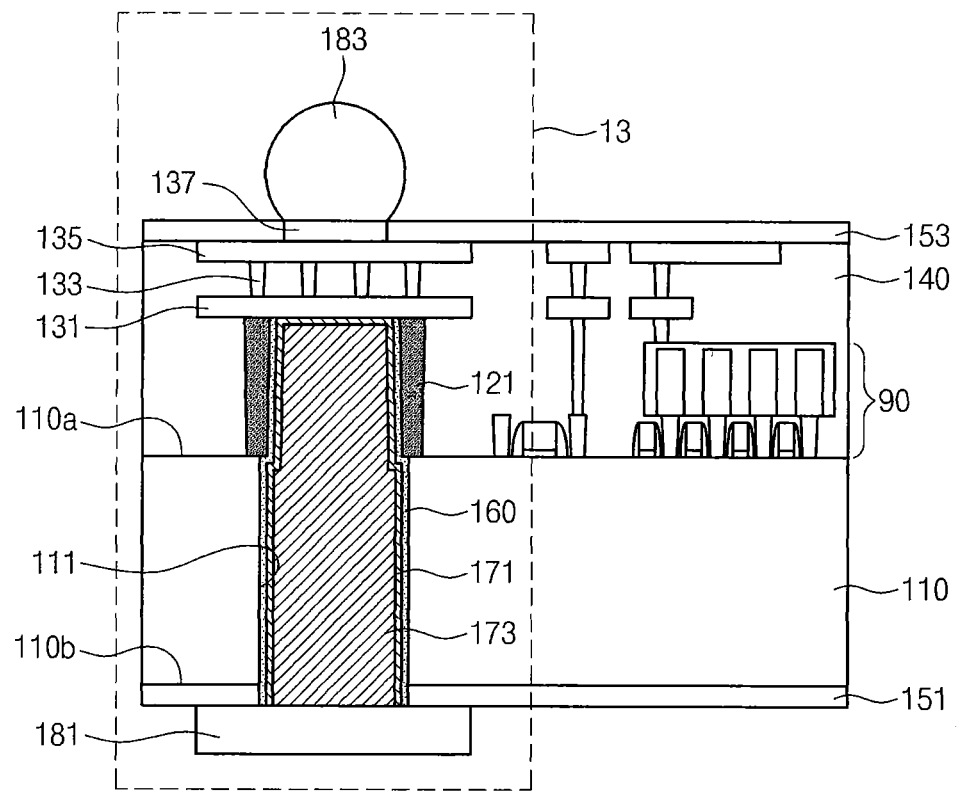
FIG. 4A is a sectional view illustrating a portion of FIG. 1 according to an example embodiment of the present inventive concepts.
Figure 4B:
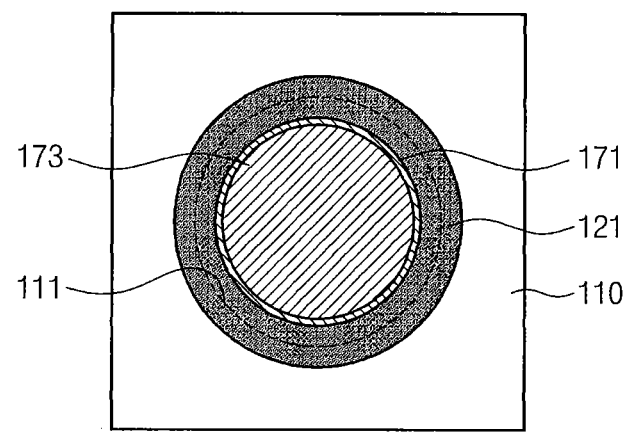
FIG. 4B is a plan view illustrating a portion of FIG. 4A.

FIG. 4A is a sectional view illustrating a portion of FIG. 1 according to an example embodiment of the present inventive concepts. FIG. 4B is a plan view illustrating a portion of FIG. 4A.

Referring to FIGS. 4A and 4B, a vertical connection structure 13, one of the electric connection structures 10 of FIG. 1, may have a structure similar to the vertical connection structure 11 of FIG. 2A. The through electrode 173 of the vertical connection structure 13 may include a portion protruding upward from the active surface 110a of the semiconductor substrate 110. For example, the through electrode 173 may be extended to fill an inner space of the first via 121. The via insulating layer 160 and the barrier layer 171 may also be extended above the active surface 110a of the semiconductor substrate 110 or extend to the first metal line 131.

Figure 5A:
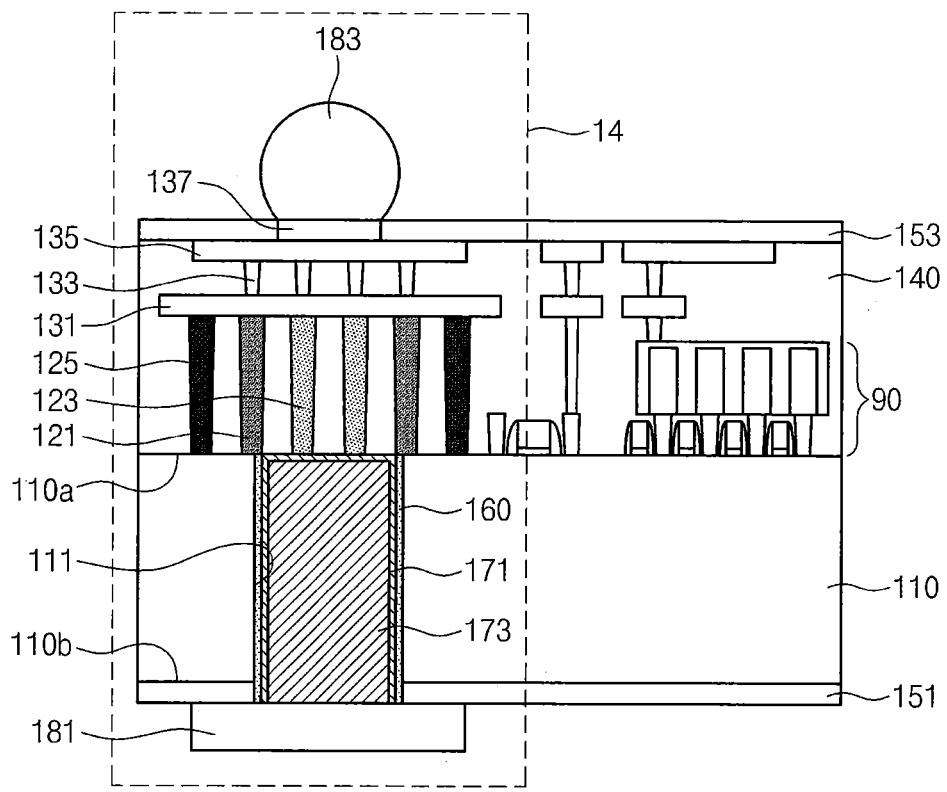
FIG. 5A is a sectional view illustrating a portion of FIG. 1 according to an example embodiment of the present inventive concepts.
Figure 5B:
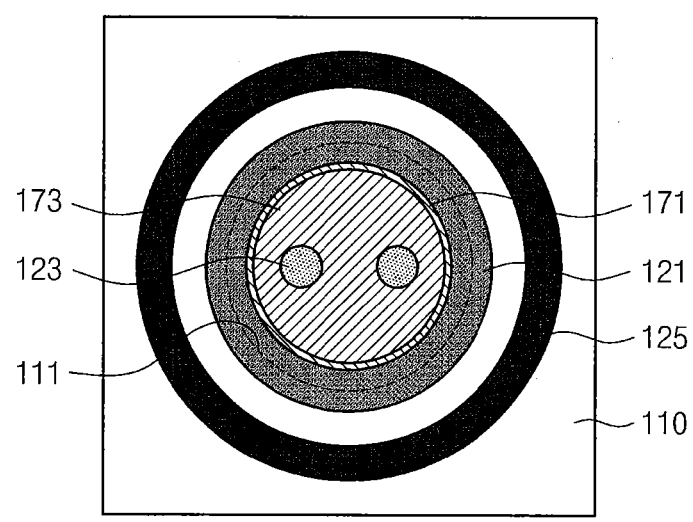
FIG. 5B is a plan view illustrating a portion of FIG. 5A.
Figure 5C:
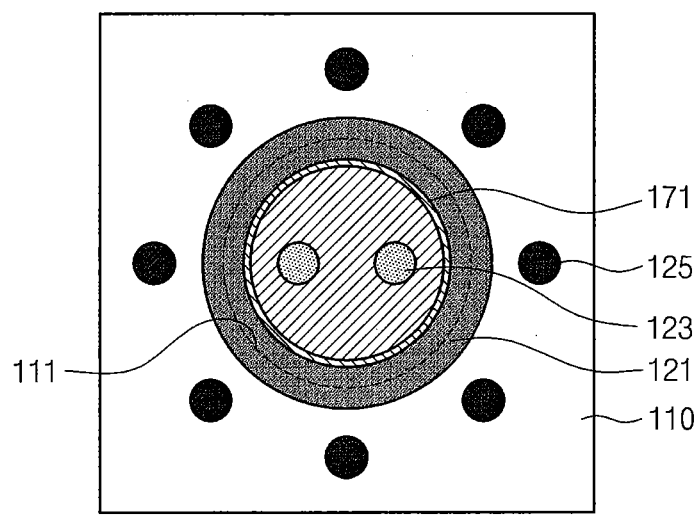
FIG. 5C is a plan view illustrating a modified example of FIG. 5B according to an example embodiment of the present inventive concepts.

FIG. 5A is a sectional view illustrating a portion of FIG. 1 according to an example embodiment of the present inventive concepts. FIG. 5B is a plan view illustrating a portion of FIG. 5A. FIG. 5C is a plan view illustrating a modified example of FIG. 5B according to an example embodiment of the present inventive concepts.

Referring to FIG. 5A, a vertical connection structure 14, one of the electric connection structures 10 of FIG. 1, may have a structure similar to the vertical connection structure 11 of FIG. 2A. The vertical connection structure 14 may further include a third via 125 provided outside the first via 121. In some embodiments, the third via 125 may be shaped like a ring and may be provided to enclose the first via 121, as shown in FIG. 5B. That is, the third via 125 may have a hollow cylindrical structure similar or identical to the first via 121. In some embodiments, the third via 125 may be provided outside the first via 121 and may be shaped like a circular pillar, as shown in FIG. 5C.

FIGS. 6A through 6H are sectional views illustrating a method of fabricating a semiconductor device according to example embodiments of the present inventive concepts. FIGS. 7A and 7B are sectional views illustrating a via hole forming process, which may be performed to fabricate a semiconductor device according to example embodiments of the inventive concepts. FIGS. 8A through 8D are sectional views illustrating a via hole forming process, which may be performed to fabricate a semiconductor device according to a comparative embodiment.

Figure 6A:
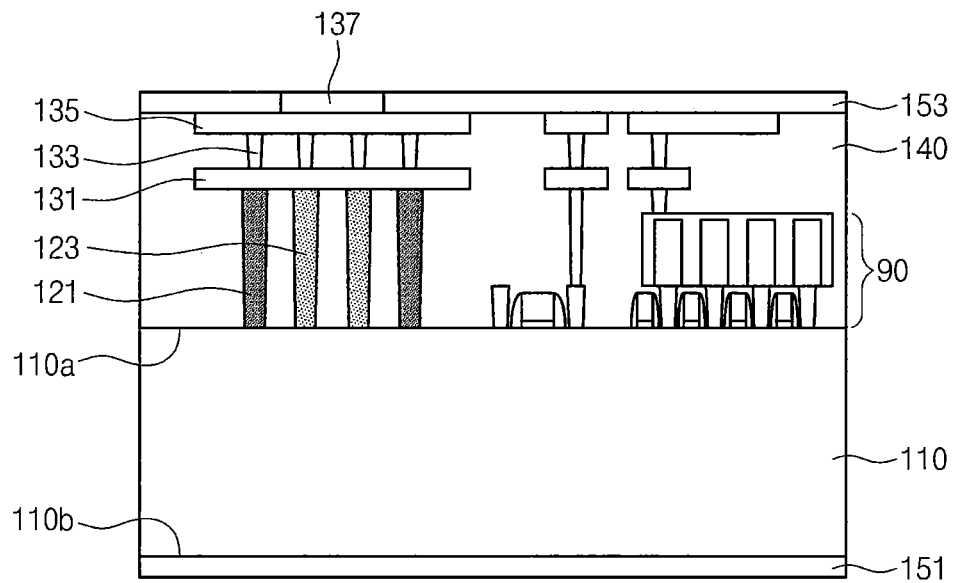
FIGS. 6A through 6H are sectional views illustrating a method of fabricating a semiconductor device according to an example embodiment of the present inventive concepts.
Figure 7A:
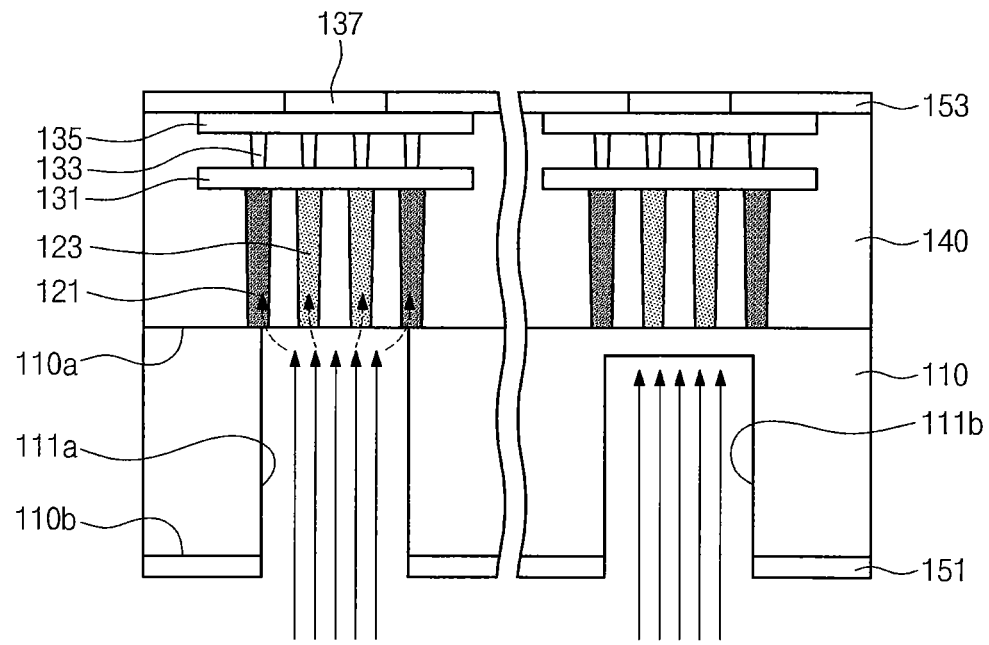
FIGS. 7A and 7B are sectional views illustrating a via hole forming process, which may be performed to fabricate a semiconductor device, according to an example embodiment of the present inventive concepts.
Figure 7B:
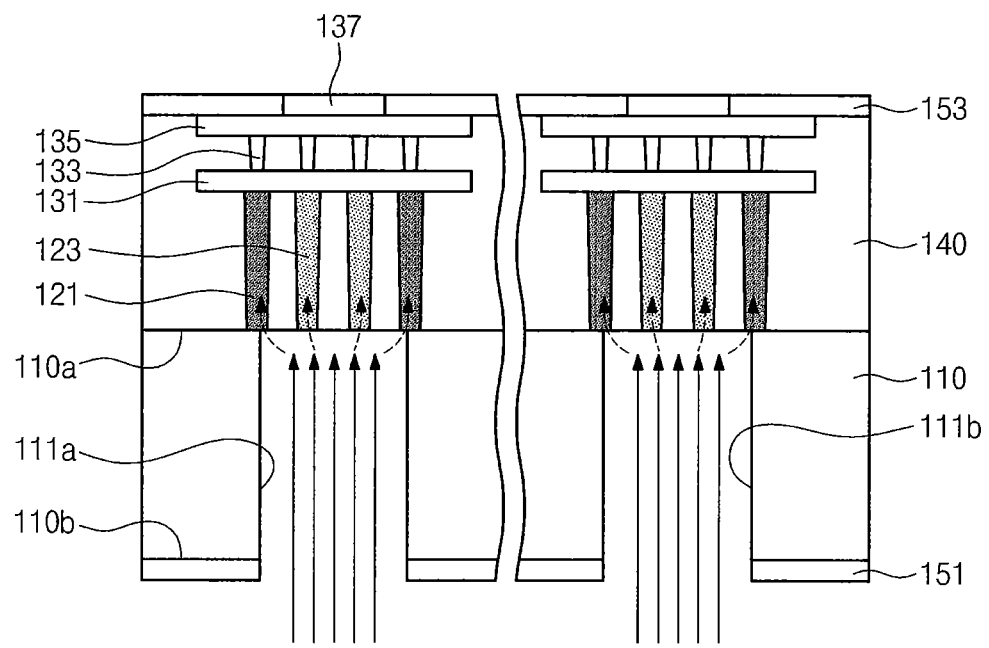

Referring to FIG. 6A, the semiconductor substrate 110 may be provided. The semiconductor substrate 110 may have the active surface 110a, on which the integrated circuit 90 are integrated, and an inactive surface 110b, which is opposite to the active surface 110a. The semiconductor substrate 110 may be a silicon substrate provided in the form of a wafer or chip. The integrated circuit 90 may be a memory circuit, a logic circuit, or any combination thereof. The interlayered insulating layer 140 may be formed on the active surface 110a of the semiconductor substrate 110. The interlayered insulating layer 140 may be formed by repeatedly depositing a silicon oxide layer or a silicon nitride layer, and thus, it may have a multi-layered structure.

The first metal lines 131 may be formed to be electrically connected to the integrated circuit 90, and optionally, the second metal lines 135 may be additionally formed on the first metal lines 131. At least one via 133 may be formed between each of the first metal lines 131 and each of the corresponding second metal lines 135 to electrically connect each of the first metal lines 131 to the corresponding one of the second metal lines 135. The pad 137 may be formed on the interlayered insulating layer 140 to be connected to a second metal line 135. An outer terminal (e.g., a solder ball) may be connected to the pad 137.

The connection vias 121, 123 may be formed outside or inside the integrated circuit 90 and may be connected to at least one of the first metal lines 131. The connection vias 121, 123 may be provided between the semiconductor substrate 110 and the first metal line 131. For example, as shown in FIG. 2B or FIG. 2C, the connection vias 121 and 123 may include the first via 121, which is shaped like a ring, and at least one second via 123, which is provided through the first via 121 and is shaped like a circular pillar. In some embodiments, the second via 123 may have a ring shape, as shown in FIG. 2D.

A silicon nitride layer or a silicon oxide layer may be deposited to form the upper protection layer 153 on the interlayered insulating layer 140 and the lower protection layer 151 on the inactive surface 110*b* of the semiconductor substrate 110. The inactive surface 110*b* of the semiconductor substrate 110 may be recessed by, for example, a chemical-mechanical polishing process and/or an etching process. The recessing of the inactive surface 110*b* may be performed before the formation of the lower protection layer 151.

Figure 6B:
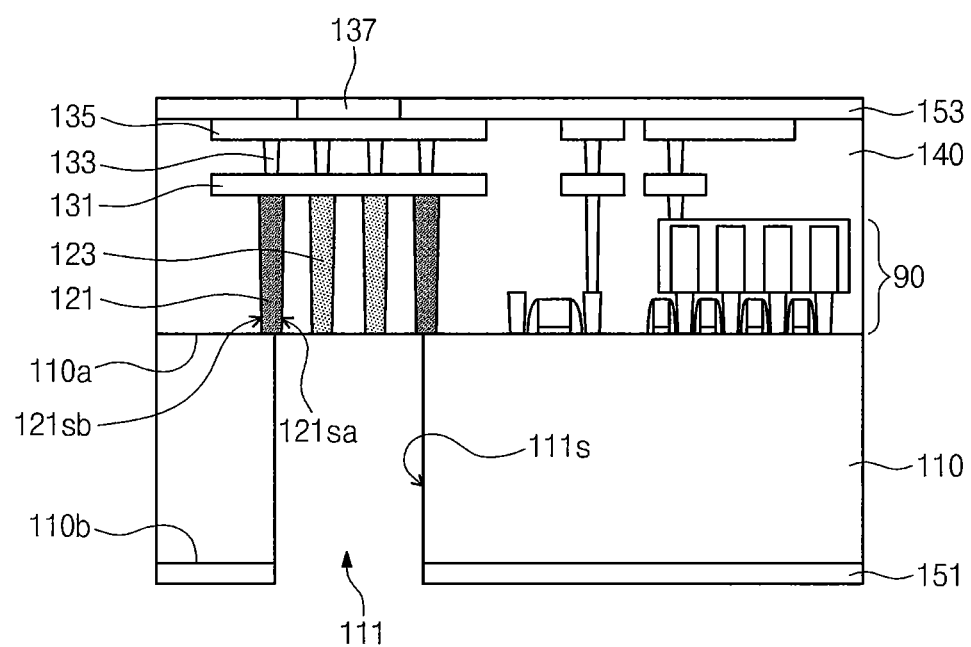

Referring to FIG. 6B, the via hole 111 may be formed through the semiconductor substrate 110. For example, an etching process (e.g., using plasma) may be performed on the inactive surface 110*b* of the semiconductor substrate 110 to form the via hole 111 having a hollow pillar shape. The via hole 111 may be formed to expose the bottom surfaces of the connection vias 121 and 123. The inner surface 111*s* of the via hole 111 may include side surfaces of the semiconductor substrate 110 and/or the lower protection layer 151 which are exposed by the via hole 111. The inner surface 111*s* of the via hole 111 may be overlapped by the first via 121. Accordingly, the interlayered insulating layer 140 located outside the first via 121 may not be exposed by the via hole 111, and the interlayered insulating layer 140 located in the first via 121 may be exposed by the via hole 111.

In some embodiments, when viewed in a plan view, the inner surface 111*s* of the via hole 111 may be positioned between inner and outer side surfaces 121*sa* and 121*sb* of the first via 121. Accordingly, at least a portion of the bottom surface of the first via 121 may be exposed by the via hole 111. In some embodiments, the inner surface 111*s* of the via hole 111 may be vertically aligned with the inner side surface 121*sa* of the first via 121. In this case, the bottom surface of the first via 121 may not be exposed by the via hole 111. As still other example, the inner surface 111*s* of the via hole 111 may be vertically aligned with the outer side surface 121*sb* of the first via 121. In this case, the bottom surface of the first via 121 may be exposed by the via hole 111.

In some embodiments, since the inner surface 111*s* of the via hole 111 is overlapped by the first via 121, it is possible to prevent a notch and/or undercut region from being formed, and this will be described with reference to FIG. 7A and FIG. 7B.

There may be a variation in an etching process and/or in thickness of the semiconductor substrate 110, and thus, as shown in FIG. 7A, formation of a right via hole 111*b* may not be finished when formation of a left via hole 111*a* is completed. Accordingly, as shown in FIG. 7B, the etching process (e.g., using plasma) may be further performed to complete the formation of the right via hole 111*b*, and in this case, as depicted by the dotted arrows, plasma charges and/or plasma ions may be supplied into the connection vias 121 and 123 through the left via hole 111*a* and may not be accumulated in the interlayered insulating layer 140.

The plasma charges supplied to the connection vias 121 and 123 may be absorbed by the first metal line 131 and/or the second metal line 135 or may be exhausted to the outside. For example, the first and second metal lines 131 and 135 may be electrically grounded, and in this case, the plasma charges may be exhausted from the semiconductor substrate 110 through the first and second metal lines 131 and 135.

Figure 8A:
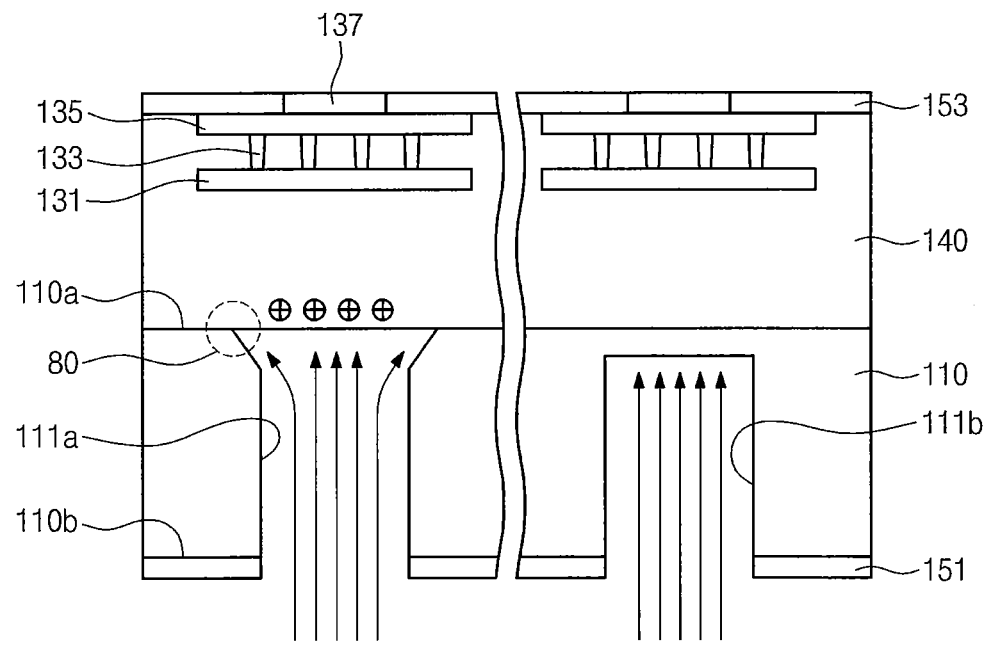
FIGS. 8A through 8D are sectional views illustrating a via hole forming process, which may be performed to fabricate a semiconductor device, according to a comparative embodiment.

Unlike the above embodiments, in the case where the connection vias 121 and 123 are not provided as shown in FIG. 8A, plasma charges supplied through the left via hole 111*a* may be increasingly accumulated in the interlayered insulating layer 140, during the plasma etching process to form the right via hole 111*b*. The accumulated plasma charges may lead to deflection of plasma charges in the plasma etching process, and consequently, a portion of the semiconductor substrate 110 adjacent to the top of the left via hole 111*a* may be unintentionally etched to form a notch 80.

Figure 8B:
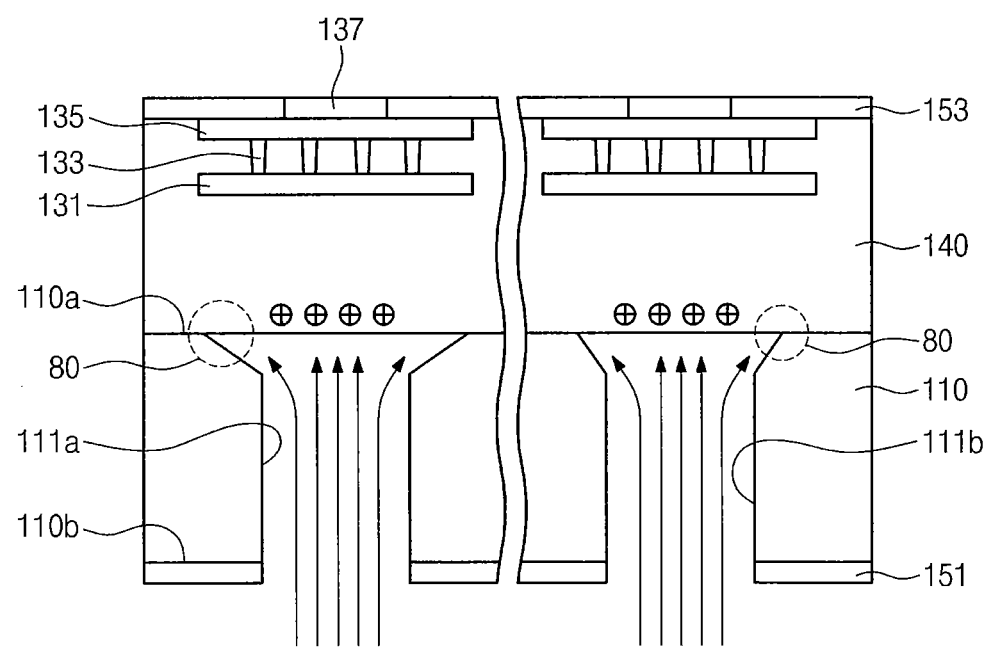

As shown in FIG. 8B, in the case where the plasma etching process is continued to form the right via hole 111*b*, the notch 80 may be expanded through the left via hole 111*a*. Furthermore, even in the right via hole 111*b*, the notch 80 may be formed through the right via hole 111*b*, due to the accumulation of the plasma charges. If, in a subsequent process, a via insulating layer is poorly deposited on the notch 80, the semiconductor substrate 110 may be unintentionally connected to the through electrode.

By contrast, according to example embodiments of the present inventive concepts, the connection vias 121, 123 may serve as pathways, allowing plasma charges to be discharged, as described previously with reference to FIGS. 7A and 7B. Accordingly, it is possible to prevent the plasma charges from being accumulated in the interlayered insulating layer 140 and consequently to prevent plasma charges in a subsequent plasma etching process from being deflected by accumulated plasma charges. That is, it is possible to prevent the notch 80 described with reference to FIG. 8A or 8B.

Figure 8C:
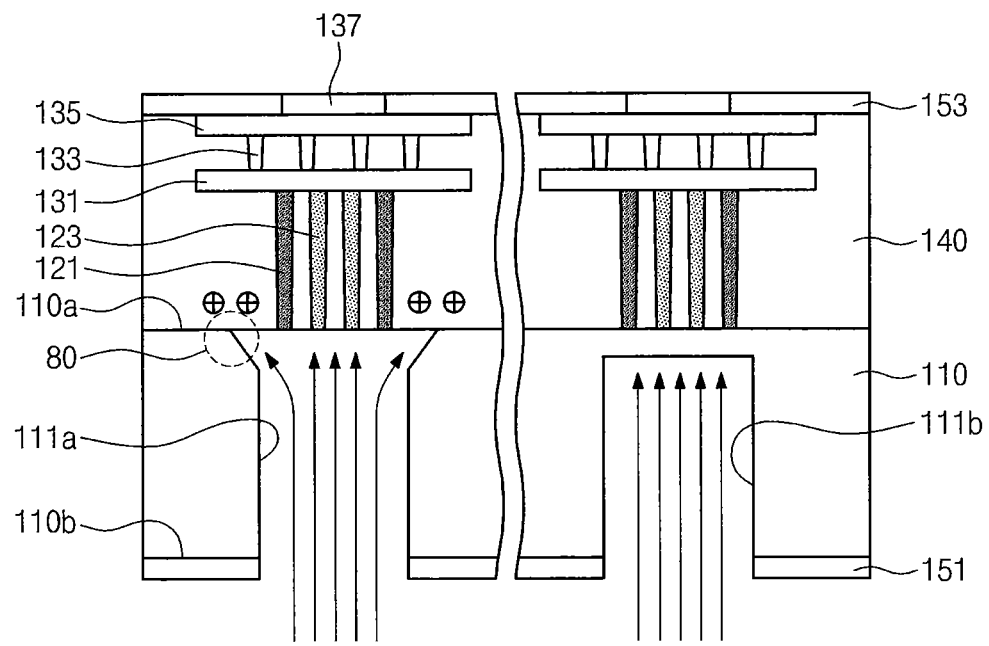
Figure 8D:
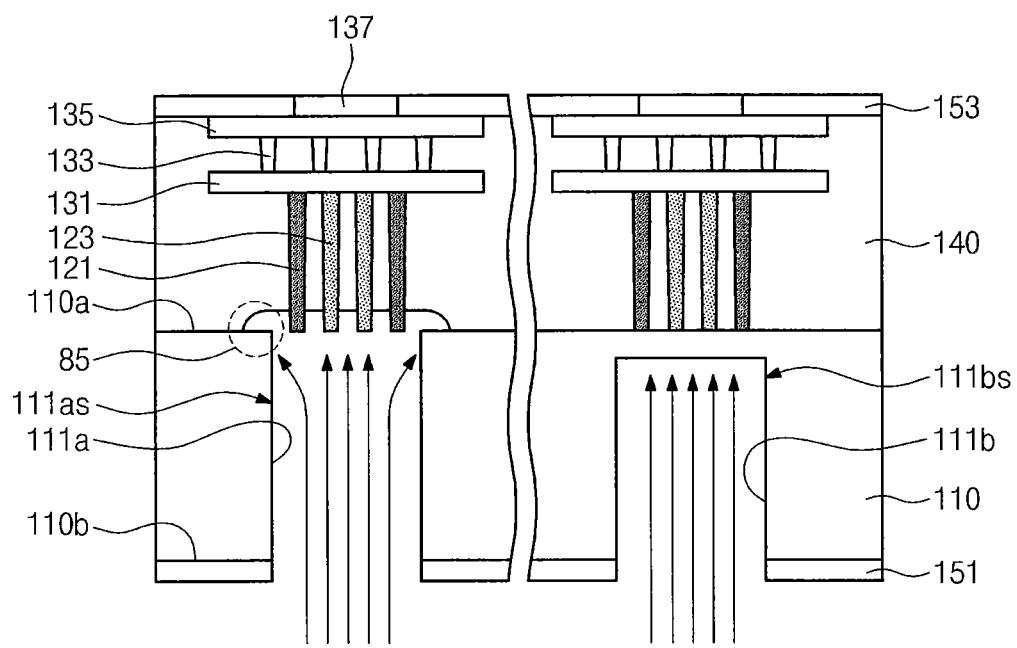

As shown in FIG. 8C or 8D, if the inner side surfaces 111*as* and 111*bs* of the first and second via holes 111*a* and 111*b* are not overlapped with the first vias 121, the first via 121 may be completely exposed through the first via hole 111*a* during the plasma etching process to form the right via hole 111*b*, even when there are the connection vias 121 and 123. Moreover, a portion of the interlayered insulating layer 140 outside the first via 121 may be exposed through the first via hole 111*a* during the plasma etching process to form the right via hole 111*b*. In this case, plasma charges may be accumulated in the interlayered insulating layer 140, and the accumulation of the plasma charges may lead to the notch 80 in the semiconductor substrate 110 as shown in FIG. 8C or an undercut region 85 in the interlayered insulating layer 140 located outside the first via 121, as shown in FIG. 8D. The presence of the notch 80 and/or the undercut region 85 may increase the possibility that a short circuit is formed between the semiconductor substrate 110 and the through electrode.

According to example embodiments of the present inventive concepts, since, as shown in FIG. 6B, the inner surface 111*s* of the via hole 111 is overlapped with the first via 121, a portion of the interlayered insulating layer 140 located outside the first via 121 may not be exposed through the via hole 111. In other words, the first via 121 may serve as a barrier preventing the outer portion of the interlayered insulating layer 140 from being exposed by the via hole 111, and thus, it is possible to suppress a notch 80 and/or an undercut region 85 from being formed.

Figure 6C:
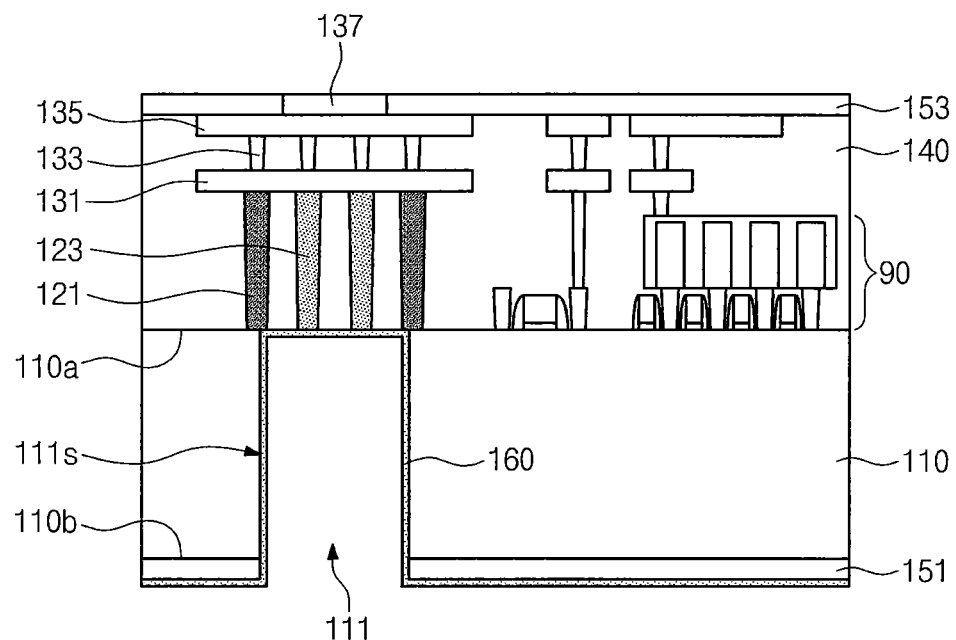

Referring to FIG. 6C, the via insulating layer 160 may be formed in the via hole 111. For example, the via insulating layer 160 may be formed by depositing a silicon oxide layer. The via insulating layer 160 may be formed to cover the inner surface 111*s* of the via hole 111, the bottom surfaces of the connection vias 121 and 123, the bottom surface of the interlayered insulating layer 140 between the connection vias 121 and 123, and the bottom surface of the lower protection layer 151.

Figure 6D:
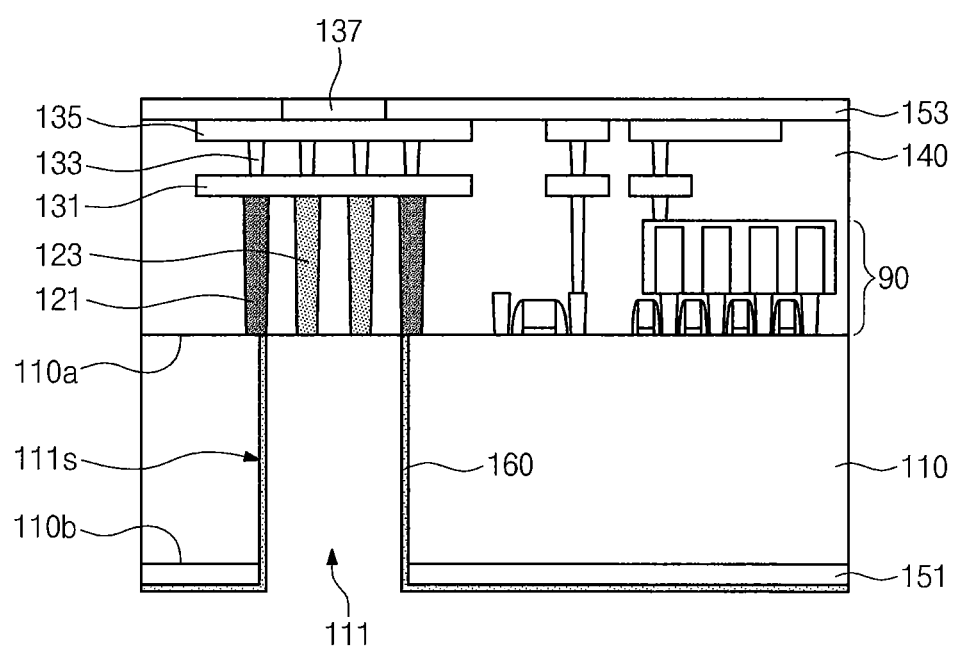
Figure 6E:
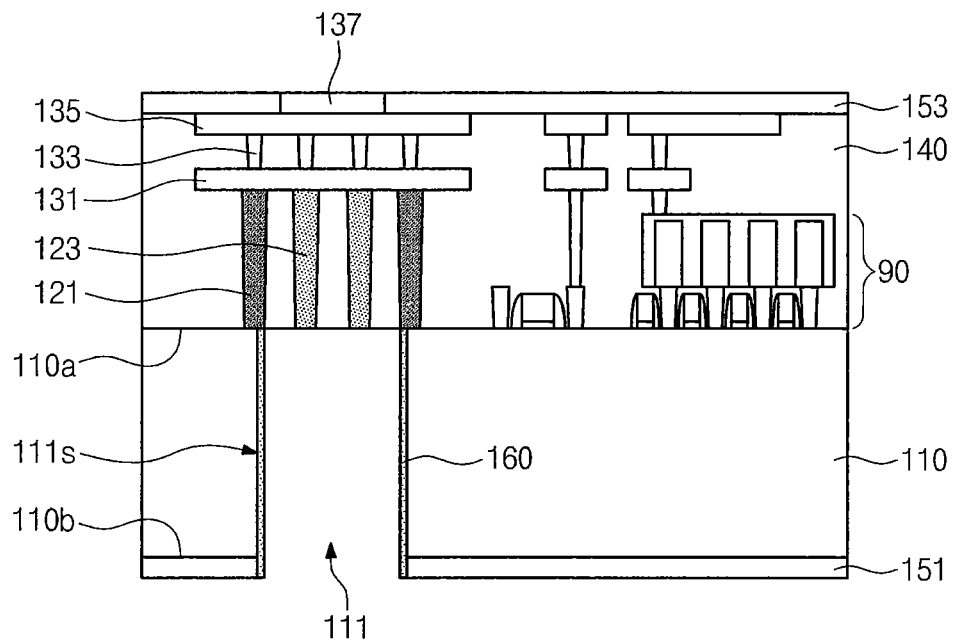

Referring to FIG. 6D, the via insulating layer 160 may be selectively removed to expose the bottom surfaces of the connection vias 121 and 123. For example, an etch-back process may be performed to selectively remove the via insulating layer 160 from the bottom surfaces of the connection vias 121 and 123 and thereby to expose at least a portion of the connection vias 121 and/or 123. As a result of the selective etch-back process, the via insulating layer 160 may remain on the inner surface 111s of the via hole 111 and the bottom surface of the lower protection layer 151. As another example, an etch-back process may be further performed to partially remove the via insulating layer 160 from the bottom surface of the lower protection layer 151, as shown in FIG. 6E. This may allow the via insulating layer 160 to remain on the inner surface 111s of the via hole 111.

Figure 6F:
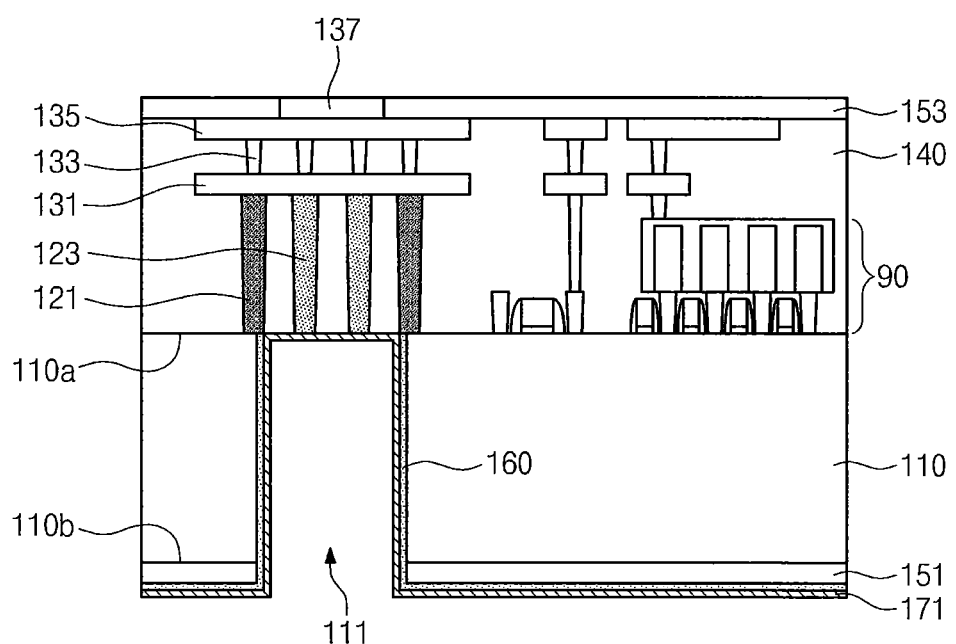

Referring to FIG. 6F, the barrier layer 171 may be formed in the via hole 111 provided with the via insulating layer 160. For example, the barrier layer 171 may be formed by depositing at least one barrier metal (e.g., titanium (Ti), titanium nitride (TiN), chromium (Cr), tantalum (Ta), tantalum nitride (TaN), nickel (Ni), tungsten (W), tungsten nitride (WN), or any combination thereof), and the use of the barrier metal may prevent metallic elements (e.g., copper) constituting the through electrode, which will be formed in a subsequent process, to be diffused into the integrated circuit 90 and/or the semiconductor substrate 110. In some embodiments, the formation of the barrier layer 171 may be omitted.

Figure 6G:
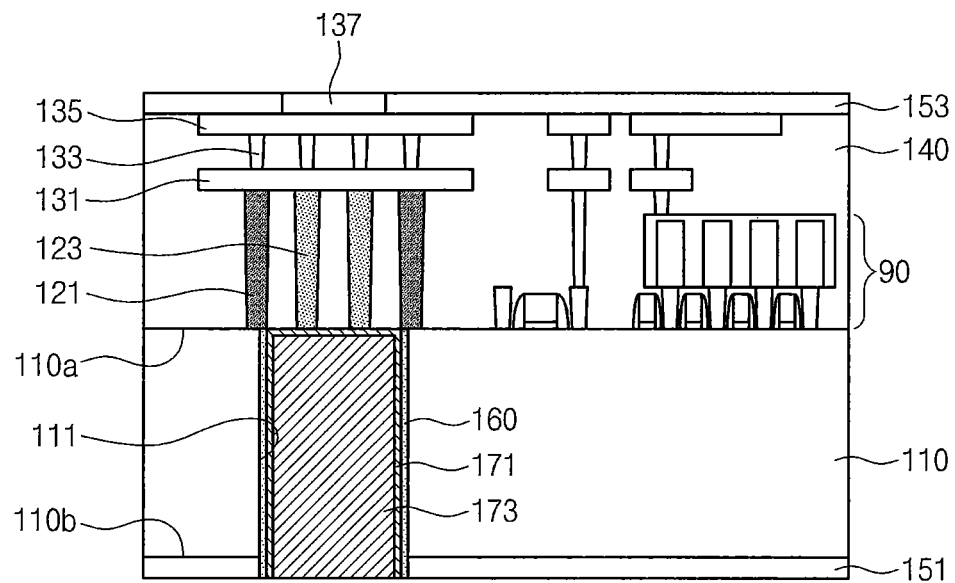

Referring to FIG. 6G, the through electrode 173 may be formed in the via hole 111. In some embodiments, the formation of the through electrode 173 may include forming a conductive layer on the inactive surface 110b of the semiconductor substrate 110 to fill the via hole 111, performing a chemical-mechanical polishing process on the conductive layer to expose the lower protection layer 151. As a result, the through electrode 173 filling the via hole 111 may be formed. The through electrode 173 may be formed of, for example, copper, and may be formed by an electroplating or deposition process. In some embodiments, where the through electrode 173 is formed by an electroplating process, the barrier layer 171 may be used as a seed layer or a seed layer may be further formed on the barrier layer 171.

Figure 6H:
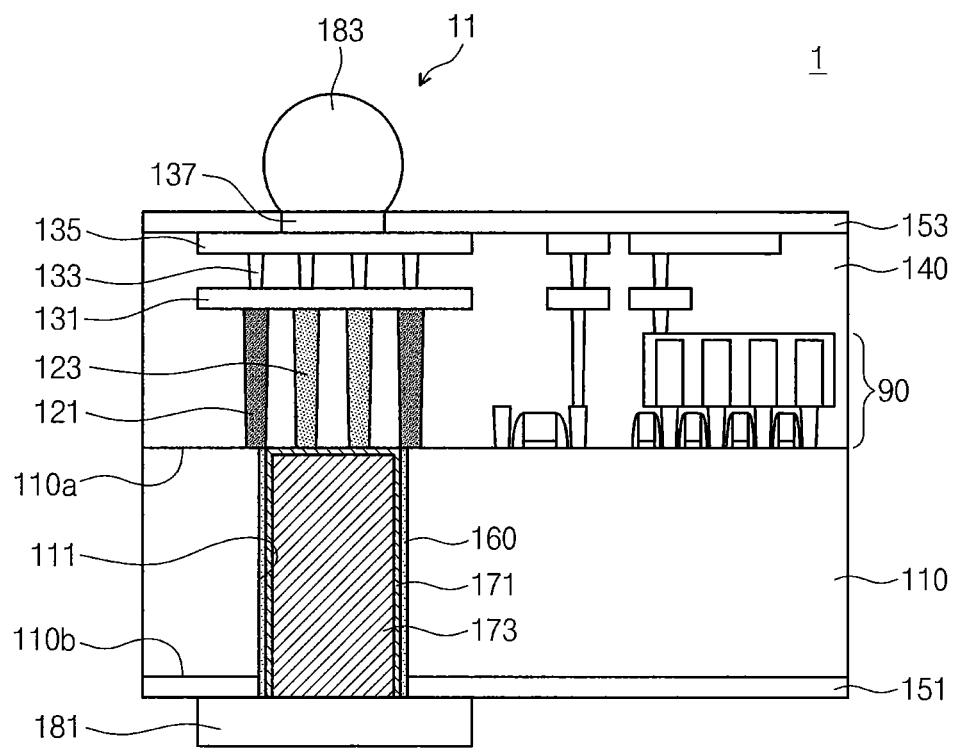

Referring to FIG. 6H, the fabrication of the semiconductor device 1 may further include forming the upper terminal 183 on the pad 137 and forming the lower terminal 181 on the lower protection layer 151 connected to the through electrode 173. The semiconductor device 1 may include the vertical connection structure 11 of FIG. 2A.

Figure 9A:
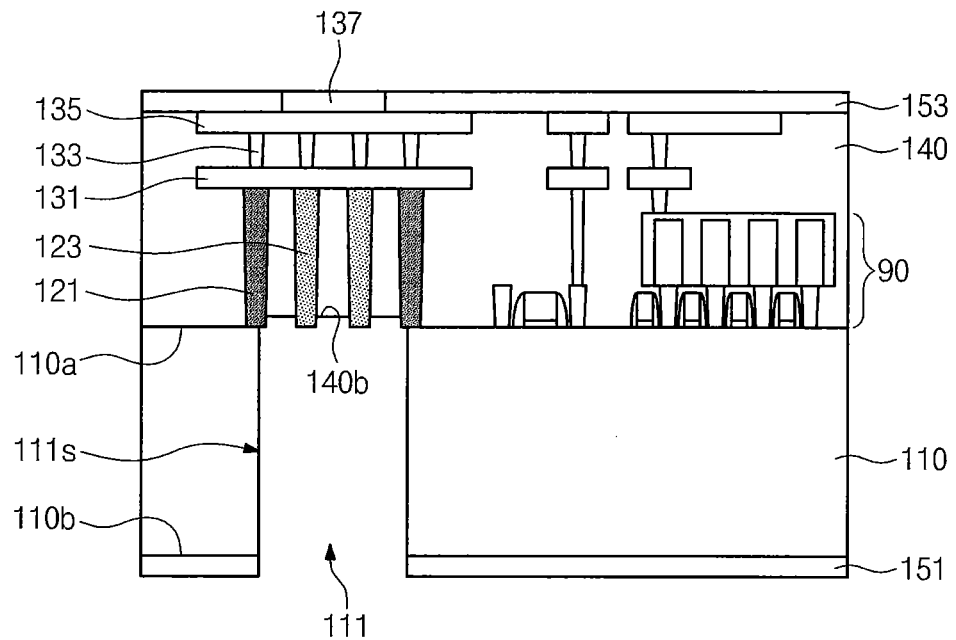
FIGS. 9A and 9B are sectional views illustrating a method of fabricating a semiconductor device according to an example embodiment of the present inventive concepts.
Figure 9B:
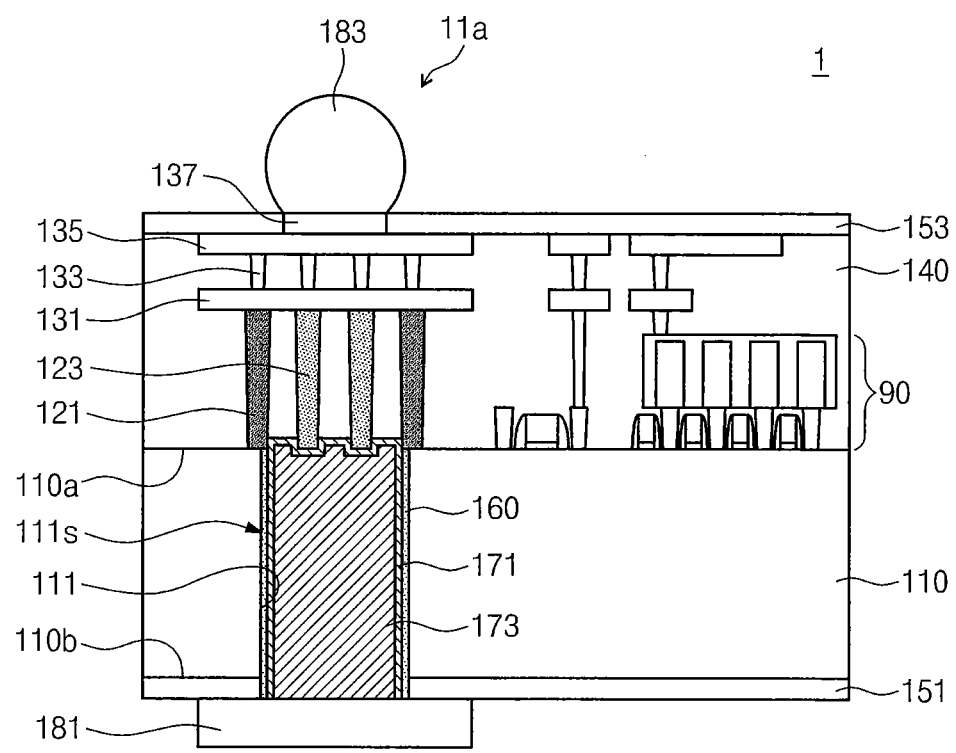

FIGS. 9A and 9B are sectional views illustrating a method of fabricating a semiconductor device according to example embodiments of the present inventive concepts.

Referring to FIG. 9A, the semiconductor substrate 110 may be provided, an etching process (e.g., using plasma) may be performed to form the via hole 111, and this process may be performed in the same or similar manner as described with reference to FIGS. 6A and 6B. During the formation of the via hole 111, at least a portion of the interlayered insulating layer 140 exposed by the via hole 111 may be recessed. Accordingly, the connection vias 121 and 123 may include portions protruding from a recessed bottom surface 140b of the interlayered insulating layer 140.

Referring to FIG. 9B, the through electrode 173 may be formed using the same or a similar process as described with reference to FIGS. 6C through 6H, and as a result, the semiconductor device 1 may be fabricated to include the vertical connection structure 11a, which is similar to the vertical connection structure 11 of FIG. 2A. The through electrode 173 may be formed to have an uneven top surface. In some embodiments, where the barrier layer 171 is further formed, the barrier layer 171 may also be formed to have an uneven top surface. By virtue of the uneven top surface of through electrode 173, the connection vias 121 and 123 may be in contact with the through electrode 173 with an increased contact area.

Figure 10A:
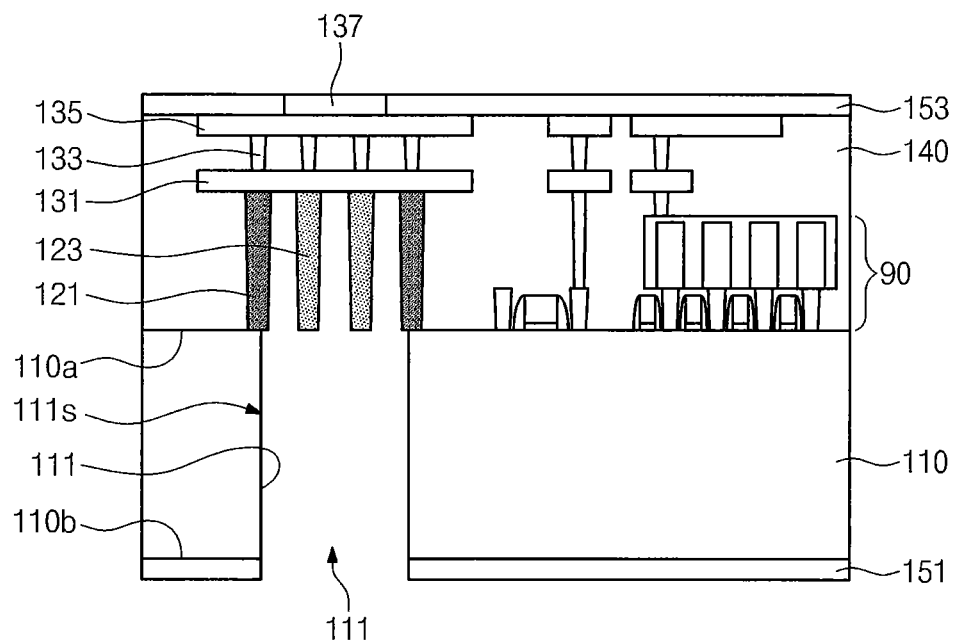
FIGS. 10A and 10B are sectional views illustrating a method of fabricating a semiconductor device according to an example embodiment of the present inventive concepts.
Figure 10B:
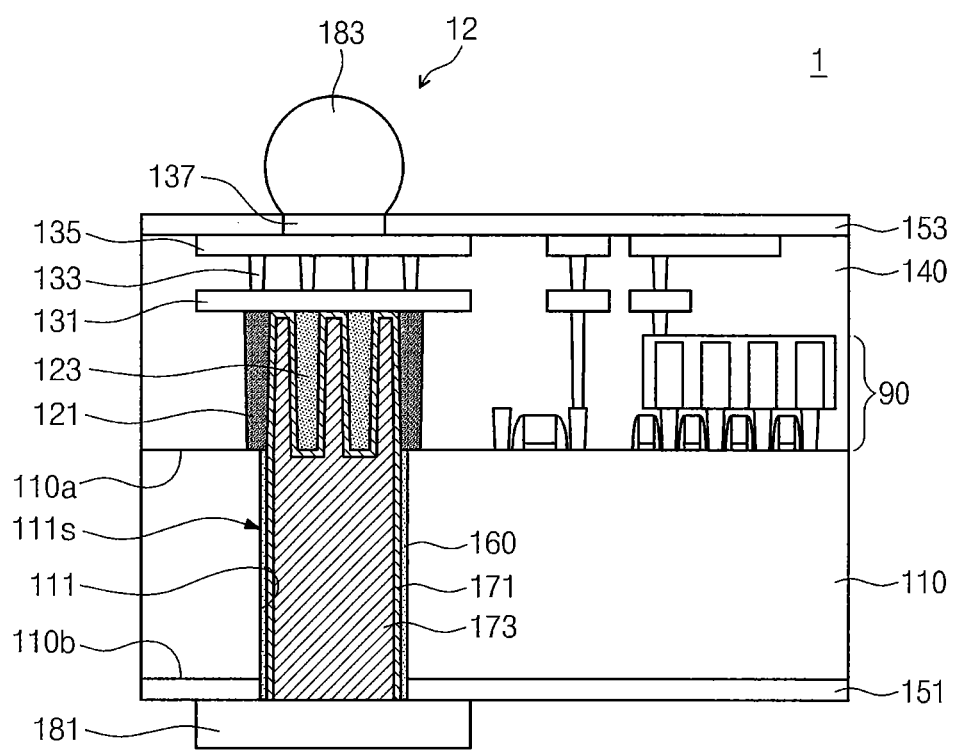

FIGS. 10A and 10B are sectional views illustrating a method of fabricating a semiconductor device according to example embodiments of the present inventive concepts.

Referring to FIG. 10A, an etching process (e.g., a plasma etching process on the inactive surface 110b of the semiconductor substrate 110) may be performed (for example, in the same or a similar manner as described with reference to FIGS. 6A and 6B) to form the via hole 111. In some embodiments, a portion of the interlayered insulating layer 140 (e.g., enclosed by the first via 121) may be further removed after the etching process on the semiconductor substrate 110, and thus, the via hole 111 may be extended over the active surface 110a of the semiconductor substrate 110. That is, the via hole 111 may be formed to expose at least a portion of the inner side surface of the first via 121 and at least a portion of the bottom and side surfaces of the second via 123.

Referring to FIG. 10B, the through electrode 173 may be formed using the same or a similar process as described with reference to FIGS. 6C through 6H, and as a result, the semiconductor device 1 may be fabricated to include the vertical connection structure 12 of FIG. 3A. The through electrode 173 may be formed to include at least a portion of the through electrode 173 protruding from the active surface 110a of the semiconductor substrate 110, at least a portion of the through electrode 173 extending between the first and second vias 121 and 123, and at least a portion of the through electrode 173 extending between adjacent ones of the second vias 123. That is, in the vertical connection structure 12, the second via 123 may have a structure inserted into the through electrode 173. Such a structure of the second via 123 and/or through electrode 172 may make it possible to increase a contact area between the through electrode 173 and the connection vias 121 and 123.

Figure 11A:
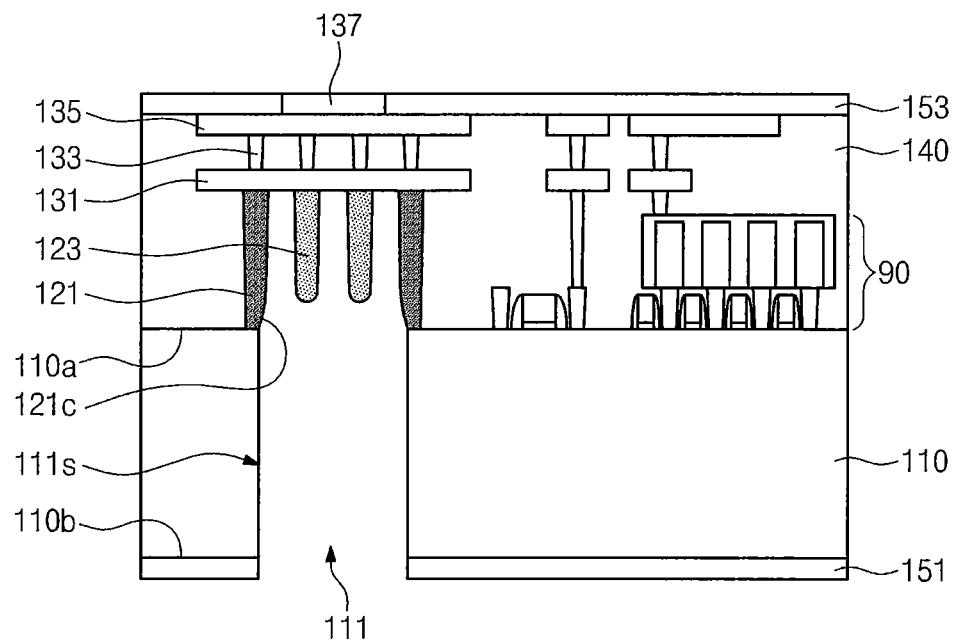
FIGS. 11A and 11B are sectional views illustrating a method of fabricating a semiconductor device according to an example embodiment of the present inventive concepts.
Figure 11B:
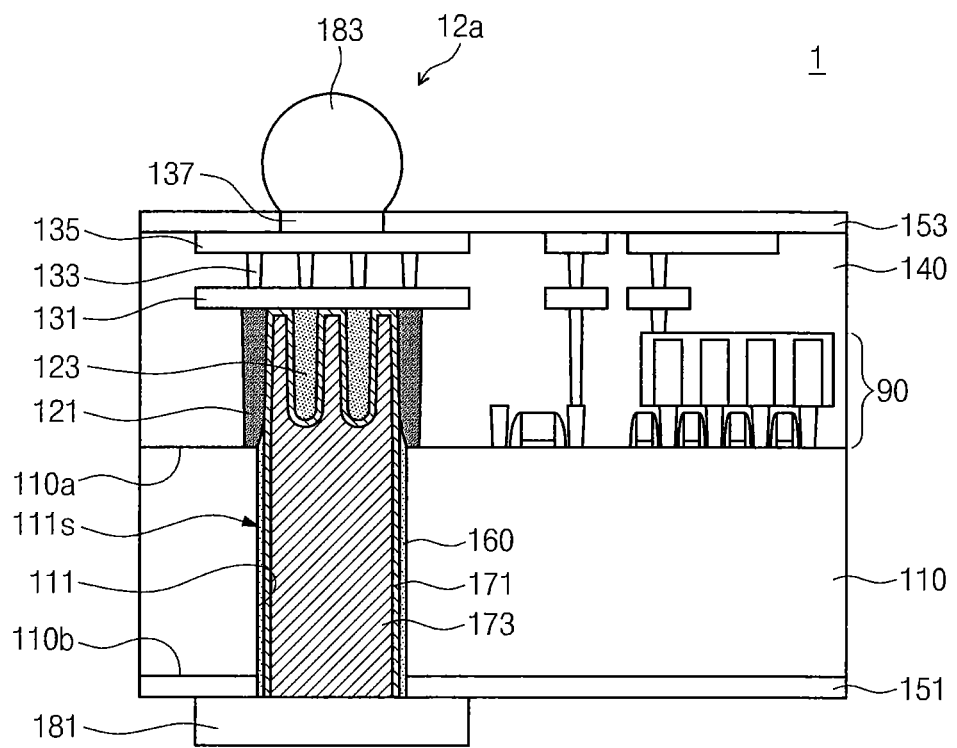

FIGS. 11A and 11B are sectional views illustrating a method of fabricating a semiconductor device according to example embodiments of the present inventive concepts.

Referring to FIG. 11A, a process may be performed (for example, in the same or a similar manner as described with reference to FIG. 10A) to form the via hole 111 extended upwardly beyond the active surface 110a of the semiconductor substrate 110. In some embodiments, when the portion of the interlayered insulating layer 140 enclosed by the first via 121 is removed to form the via hole 111, portions of the connection vias 121, 123 may also be removed. For example, a lower corner 121c of the first via 121 may be etched, and a lower portion of the second via 123 may be etched to have a reduced vertical length.

Referring to FIG. 11B, the through electrode 173 may be formed using the same or a similar process as described with reference to FIGS. 6C through 6H, and as a result, the semiconductor device 1 may be fabricated to include the vertical connection structure 12a that is similar to the vertical connection structure 12 of FIG. 3A. The vertical connection structure 12a may include the first via 121 and the second via 123, which has a shorter vertical length than the first via 121.

Figure 12A:
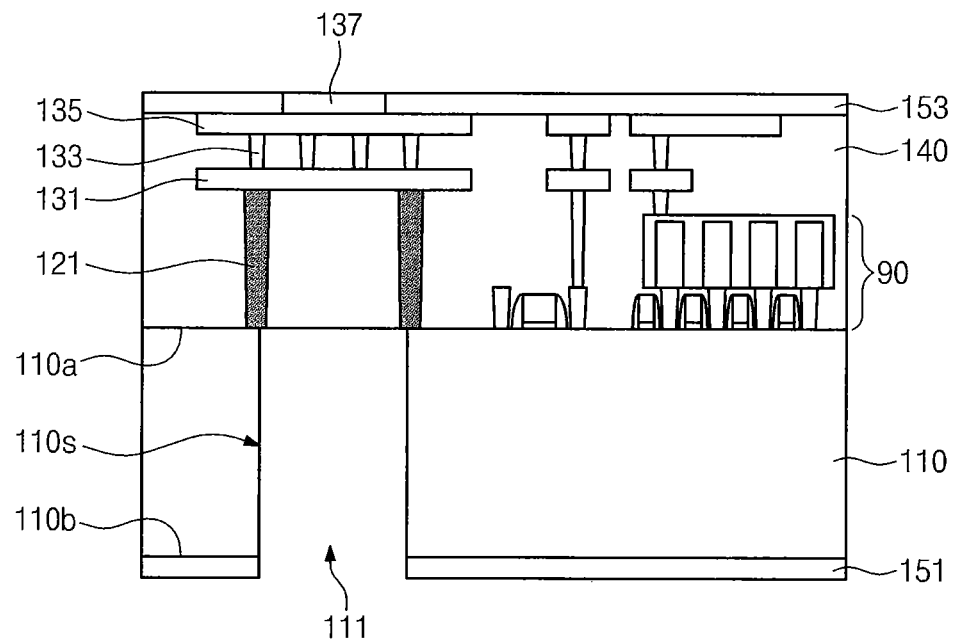
FIGS. 12A through 12C are sectional views illustrating a method of fabricating a semiconductor device according to an example embodiment of the present inventive concepts.
Figure 12B:
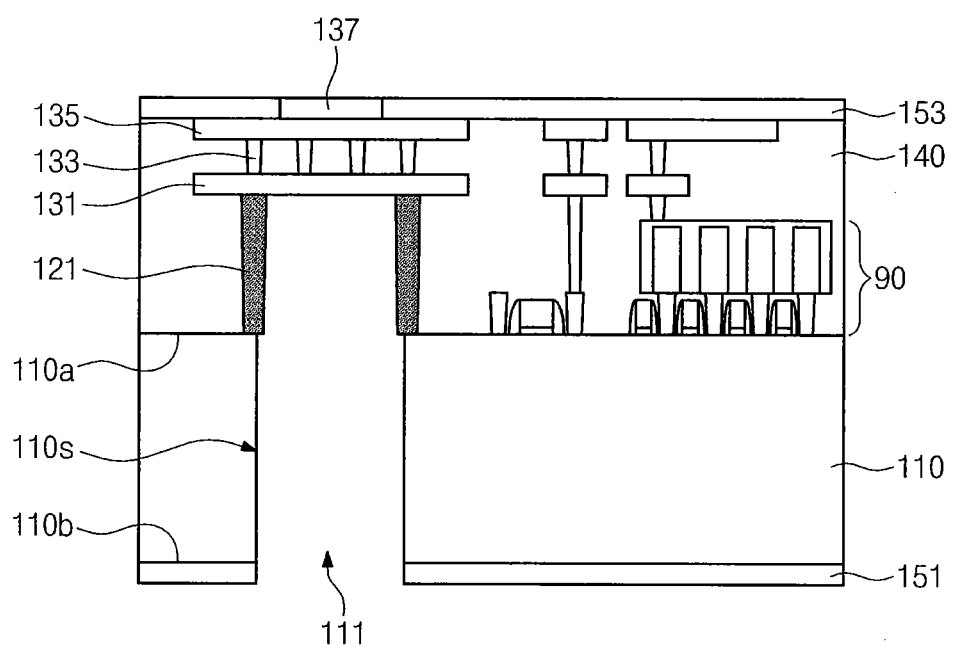
Figure 12C:
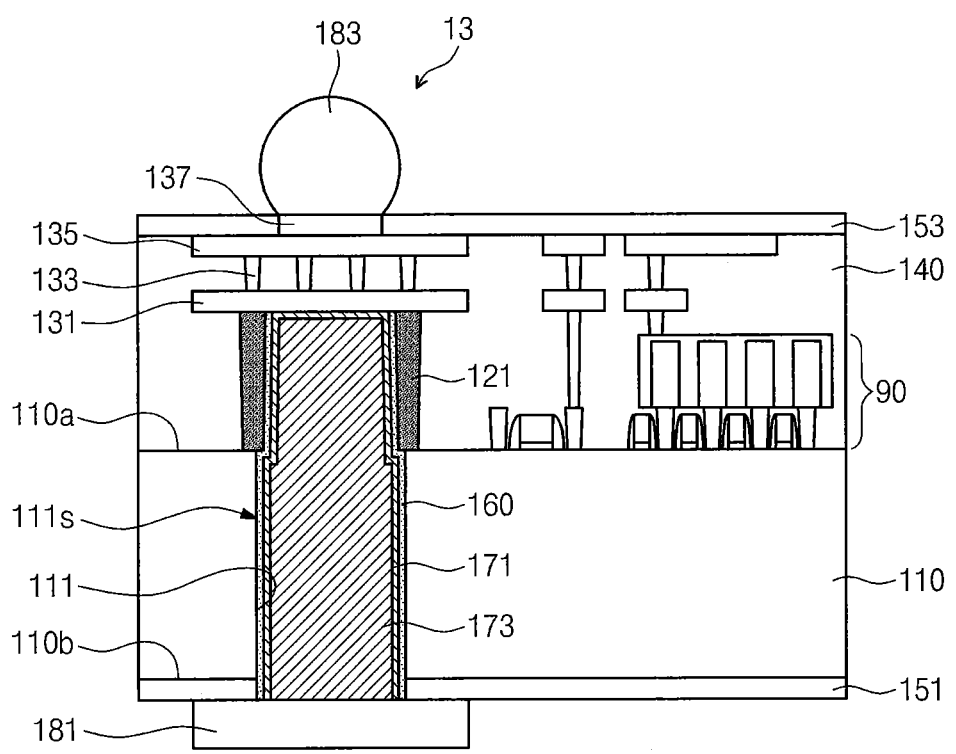

FIGS. 12A through 12C are sectional views illustrating a method of fabricating a semiconductor device according to example embodiments of the present inventive concepts.

Referring to FIG. 12A, a process (e.g., a plasma etching process on the inactive surface 110b of the semiconductor substrate 110) may be performed (for example, in the same or a similar manner as described with reference to FIGS. 6A and 6B) to form the via hole 111. In some embodiments, the second via 123 of FIG. 6A may not be formed in an inner space of the first via 121.

Referring to FIG. 12B, a portion of the interlayered insulating layer 140 may be removed from the inner space of the first via 121, and this may allow for the via hole 111 to extend above the active surface 110a of the semiconductor substrate 110. The extension of the via hole 111 may be performed to expose an inner side surface of the first via 121 and the first metal line 131.

Referring to FIG. 12C, a process may be performed (for example, in the same or a similar manner as described with reference to FIGS. 6C through 6H) to form the through electrode 173, and the through electrode 173 may be used as a part of the semiconductor device 1 provided with the vertical connection structure 13 of FIG. 4A. According to some embodiments, it is possible to increase a connection area between the through electrode 173 and the first metal line 131.

Figure 13A:
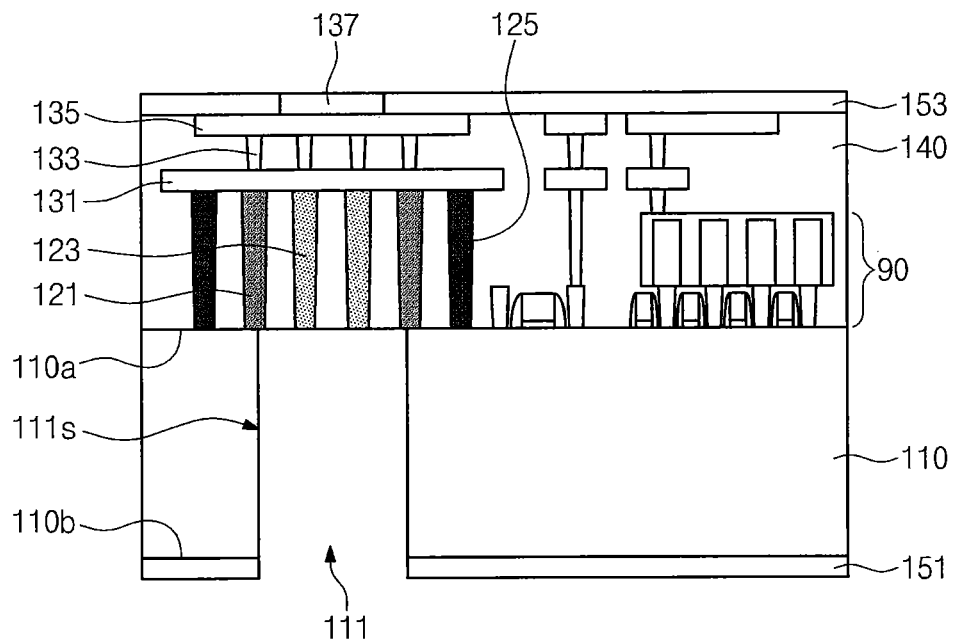
FIGS. 13A through 13C are sectional views illustrating a method of fabricating a semiconductor device according to an example embodiment of the present inventive concepts.
Figure 13B:
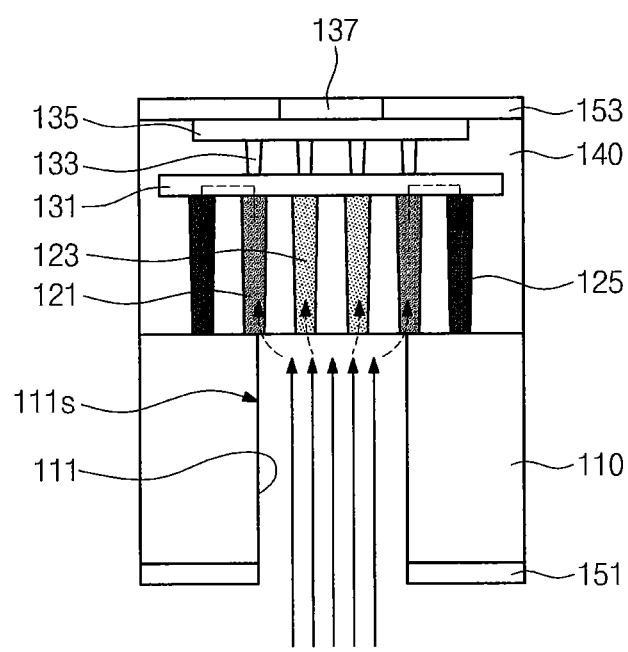
Figure 13C:
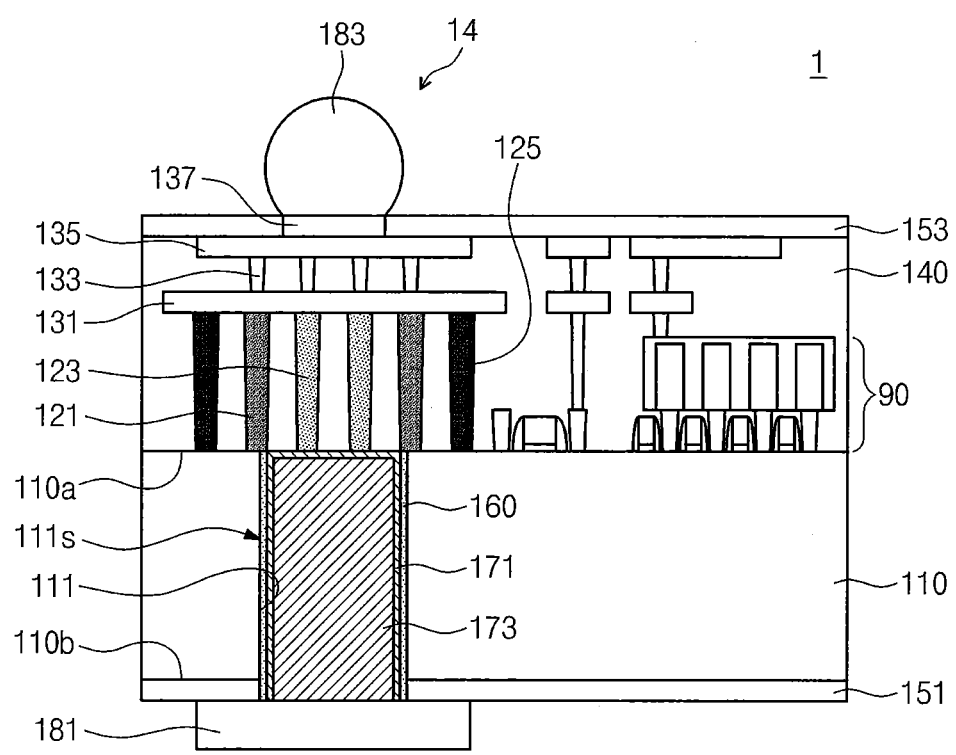

FIGS. 13A through 13C are sectional views illustrating a method of fabricating a semiconductor device according to example embodiments of the present inventive concepts.

Referring to FIG. 13A, a process (e.g., a plasma etching process on the inactive surface 110b of the semiconductor substrate 110) may be performed (for example, in the same or a similar manner as described with reference to FIGS. 6A and 6B) to form the via hole 111. In some embodiments, the third via 125 connected to the first metal line 131 may be formed outside the first via 121. In addition, the third via 125 may be connected to the semiconductor substrate 110.

As an example, the third via 125 may be provided to enclose the first via 121 and have a ring shape, as shown in FIG. 5B. As another example, the third via 125 may have a circular pillar shape, like the second via 123 of FIG. 2B or FIG. 2C.

Referring to FIG. 13B, in the case where the via hole 111 is formed using, for example, a plasma etching process, plasma charges may move and/or diffuse into the first via 121 and/or the second via 123 and can be prevented from being accumulated in the interlayered insulating layer 140. In some embodiments, at least some of the plasma charges may be exhausted to the semiconductor substrate 110 through the third via 125. That is, the plasma charges may be absorbed by the first metal line 131, the second metal line 135, and/or the semiconductor substrate 110 and/or may be exhausted to the outside.

Referring to FIG. 13C, the through electrode 173 may be formed using the same or a similar process as described with reference to FIGS. 6C through 6H, and as a result, the semiconductor device 1 may be fabricated to include the vertical connection structure 14 of FIG. 5A. The structure of the through electrode 173 may be variously modified, as previously described with reference to the above embodiments. For example, the through electrode 173 may be formed to have an uneven top surface, as shown in FIG. 9B, or it may extend upwardly beyond the active surface 110a of the semiconductor substrate 110 to have a portion located between the connection vias 121 and 123, as shown in FIG. 10B or FIG. 11B, or to have a portion filling an internal space of the first via 121, as shown in FIG. 12C.

Figure 14A:
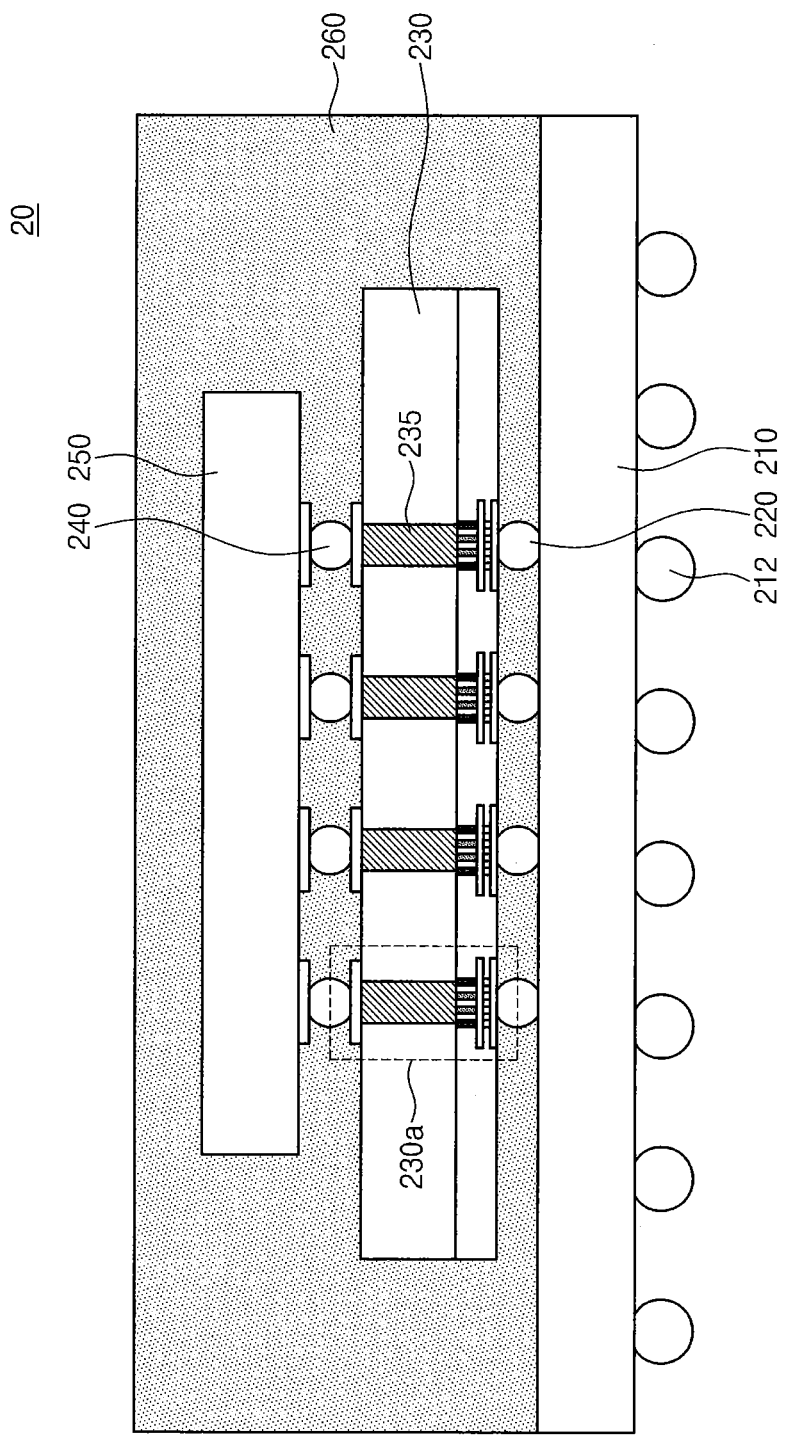
FIG. 14A is a sectional view illustrating a semiconductor package in which a through electrode of a semiconductor device according to an example embodiment of the present inventive concepts is used to realize a three-dimensional stack structure.
Figure 14B:
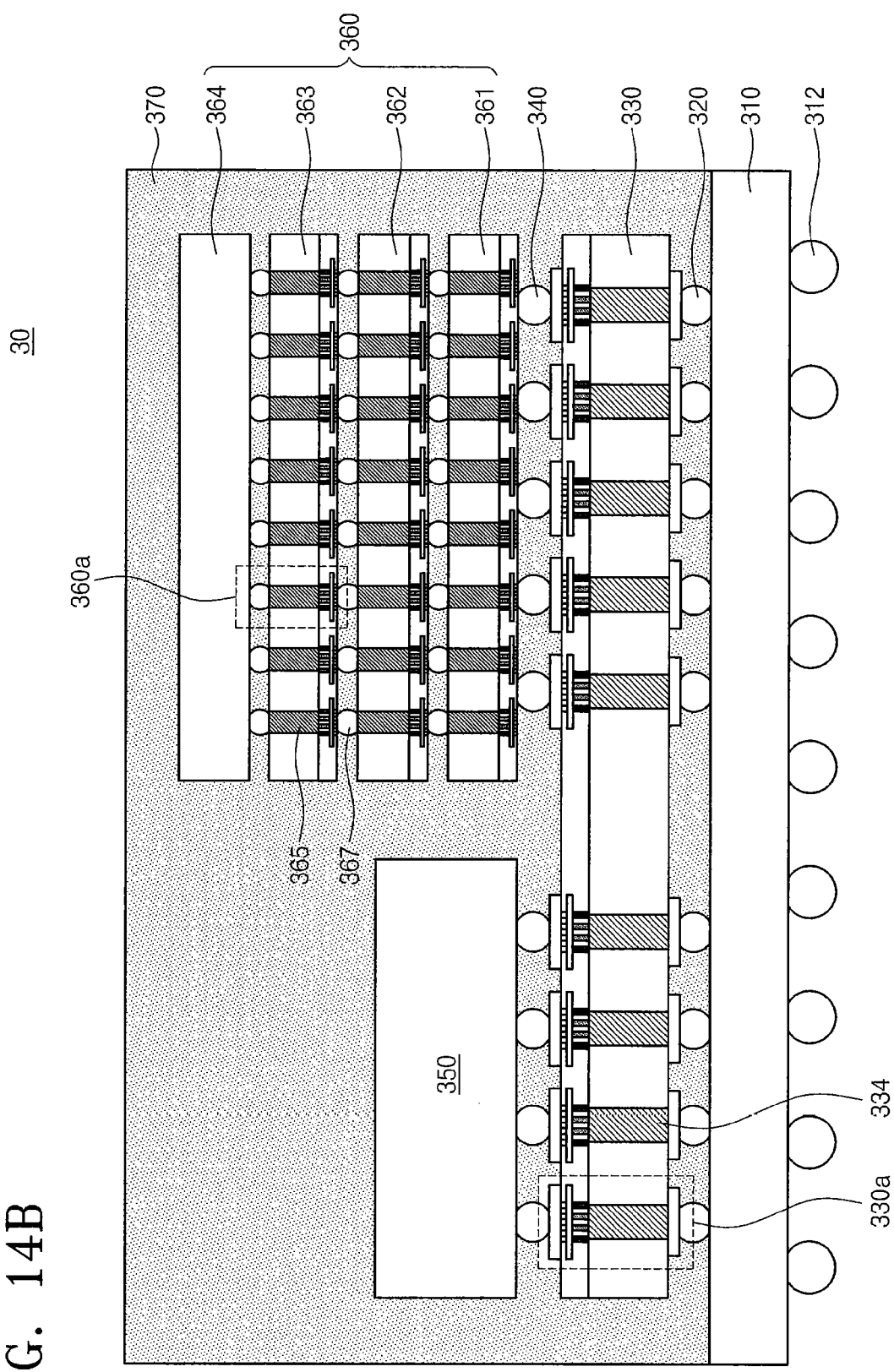
FIG. 14B is a sectional view illustrating a semiconductor module in which a through electrode of a semiconductor device is provided according to an example embodiment of the present inventive concepts.
Figure 14C:
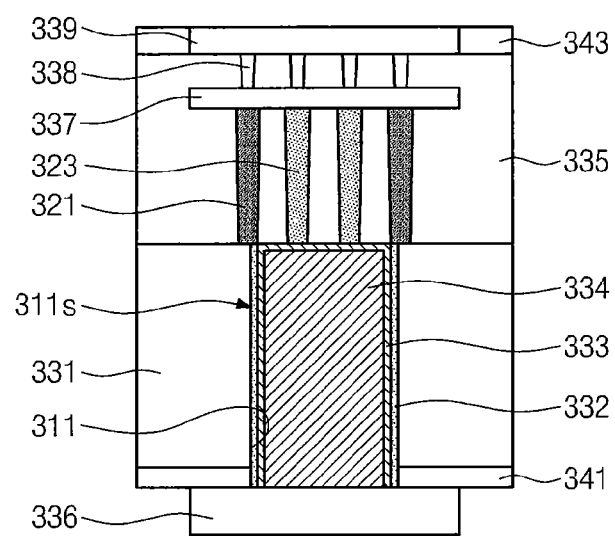
FIG. 14C is an enlarged sectional view illustrating a portion of FIG. 14B.

FIG. 14A is a sectional view illustrating a semiconductor package in which a through electrode of a semiconductor device according to example embodiments of the present inventive concepts is used to realize a three-dimensional stack structure. FIG. 14B is a sectional view illustrating a semiconductor module in which a through electrode of a semiconductor device according to example embodiments of the present inventive concepts is provided. FIG. 14C is an enlarged sectional view illustrating a portion of FIG. 14B.

Referring to FIG. 14A, a semiconductor package 20 may include a package substrate 210 (e.g., a printed circuit board) attached with an outer terminal 212, an application processor 230 mounted on the package substrate 210, a memory chip 250 stacked on the application processor 230, and a mold layer 260 covering the application processor 230 and the memory chip 250. The semiconductor package 20 may be used to realize mobile products (e.g., cellular phones and/or tablet computers).

The application processor 230 may be electrically connected to the package substrate 210 via a solder ball 220, which is disposed on the package substrate 210. The memory chip 250 may be electrically connected to the application processor 230 via a solder ball 240, which is disposed on the application processor 230. The application processor 230 may be mounted on the package substrate 210 to have an active surface facing the package substrate 210 or the memory chip 250. The memory chip 250 may be stacked on the application processor 230 to have an active surface facing the application processor 230.

The application processor 230 may include an electric connection structure 230a with a through electrode 235. The through electrode 235 may be electrically connected to the solder ball 220 and the solder ball 240. The electric connection structure 230a may be provided to have substantially the same or a similar structure as the electric connection structure 10 shown in FIG. 1. For example, the electric connection structure 230a may be configured to have substantially the same features as those of the electric connection structures 10 described with reference to FIG. 1.

Referring to FIG. 14B, a semiconductor module 30 may be, for example, a memory module including a package substrate 310 (e.g., a printed circuit board) attached with an outer terminal 312, a chip stack 360 mounted on the package substrate 310, a graphic processing unit (GPU) 350, and a mold layer 370 covering the chip stack 360 and the graphic processing unit 350. The semiconductor module 30 may further include an interposer 330 provided on the package substrate 310.

The chip stack 360 may include a plurality of stacked high-band memory chips 361, 362, 363, and 364. The memory chips 361-364 may be electrically connected to each other via solder balls 367. At least one of the memory chips 361-364 may include an electric connection structure 360a with a through electrode 365.

For example, each of the first, second, and third memory chips 361, 362, and 363 may be configured to include at least one electric connection structure 360a. The through electrode 365 may not be provided in the fourth memory chip 364. Alternatively, in some embodiments, the fourth memory chip 364 may also be configured to include at least one electric connection structure 360a with a through electrode 365.

The electric connection structure 360a of the chip stack 360 may be provided to have substantially the same or a similar structure as the electric connection structure 10 shown in FIG. 1. For example, the electric connection structure 360a may be configured to have substantially the same features as those of the electric connection structures 10 described with reference to FIG. 1.

The graphic processing unit 350 and the chip stack 360 may be electrically connected to the interposer 330 via a solder ball 340, which is disposed on the interposer 330. The interposer 330 may be electrically connected to the package substrate 310 via a solder ball 320, which is disposed on the package substrate 310.

The interposer 330 may include an electric connection structure 330a with a through electrode 334. The electric connection structure 330a may be provided to have substantially the same or similar structure as the electric connection structure 10 shown in FIG. 1.

In some embodiments, the electric connection structure 330a of the interposer 330 may include the through electrode 334 vertically passing through a semiconductor substrate 331 (e.g., a silicon wafer), as shown in FIG. 14C. An insulating layer 335 may be disposed on the semiconductor substrate 331, and a first via 321 and a second via 323 may be provided in the insulating layer 335 to be connected to a metal line 337 in the insulating layer 335. An upper pad 339 may be provided on the insulating layer 335 and may be coupled to a via 338 connected to the metal line 337. The solder ball 340 (e.g., of FIG. 14B) may be coupled to the upper pad 339.

A via insulating layer 332 may be provided to enclose the through electrode 334 and to electrically isolate the through electrode 334 from the semiconductor substrate 331. A barrier layer 333 may be provided between the through electrode 334 and the via insulating layer 332 to prevent metallic elements (e.g., copper) constituting the through electrode 334 from being diffused into the semiconductor substrate 331.

A lower pad 336 may be provided on a bottom of the through electrode 334. The solder ball 320 of FIG. 14B may be attached to and coupled to the lower pad 336. An upper protection layer 343 may be provided on the insulating layer 335, and a lower protection layer 341 may be provided on the bottom surface of the semiconductor substrate 331.

The through electrode 334 may be provided in a via hole 311 penetrating the semiconductor substrate 331. The via hole 311 may be formed to have an inner surface 311s overlapped with the first via 321. Similar to the first via 121 of FIG. 2B, the first via 321 may be provided to have a ring shape, when viewed in a plan view.

According to example embodiments of the present inventive concepts, electric charges and/or ions (e.g., plasma charges and/or plasma ions) may be prevented from being accumulated (e.g., in a portion of an insulating layer) and consequently may provide the ability to form through electrodes without a notch and/or undercut. In some embodiments, a semiconductor device with stable electric characteristics may be realized and/or achieved, while preventing and/or avoiding the through electrode from being unintentionally connected to the semiconductor substrate at a notch and/or undercut. In some embodiments, at least one via may be provided to prevent electric charges and/or ions from being accumulated, such as in a portion of an insulating layer, and/or to provide a charge-discharging path. In some embodiments, the at least one via may prevent electric charges and/or ions from accumulating in an insulating layer. The at least one via may prevent the formation notch and/or under cut at an interface between the insulating layer and a portion of a substrate adjacent to the at least one via and/or may reduce the degree to which a notch and/or under cut is formed at an interface between the insulating layer and a portion of a substrate adjacent to the at least one via. In some embodiments, a ring-shaped via may be formed on a semiconductor substrate. The ring-shaped via may be used as a charge-discharging path and/or may reduce or prevent accumulation of charges and/or ions in the insulating layer.

Some embodiments of the present inventive concepts may prevent and/or reduce charge deflection and/or formation of a notch and/or undercut.

The foregoing is illustrative of the present inventive concepts and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concepts as well as the appended claims.

What is claimed is:

1. A semiconductor device, comprising:
   a substrate having electrically active and electrically inactive surfaces facing each other:
   a through electrode passing through the substrate and extending from the electrically active surface to the electrically inactive surface;
   an interconnection line provided on the electrically active surface of the substrate; and
   a first via provided between the through electrode, and the interconnection line that electrically connects the through electrode to the interconnection line,
   wherein the first via is a ring-shaped structure and at least a portion of the first via extends at a circumference of the through electrode.

2. The semiconductor device of claim 1, wherein the through electrode fills at least a portion of a via hole in the substrate,
   wherein the via hole has an inner surface defining an interface between the substrate and the through electrode,
   the first via has a top surface adjacent to the interconnection line and a bottom, surface adjacent to the through electrode, and
   the bottom surface of the first via overlaps the inner surface of the via hole.

3. The semiconductor device of claim 2, wherein the through electrode extends beyond the electrically active surface of the substrate to fill an internal space at least partially defined by the first via.

4. The semiconductor device of claim 1, further comprising a second via provided inside an area defined by the first via, wherein the second via electrically connects the through electrode to the interconnection line.

5. The semiconductor device of claim 4, wherein the second via is a pillar-shaped structure that extends between the interconnection line and the through electrode.

6. The semiconductor device of claim 4, wherein the second via is a ring-shaped structure that extends between the interconnection line and the through electrode, and at least a portion of the second via extends at a circumference of the through electrode.

7. The semiconductor device of claim 4, wherein the through electrode has a top surface facing the interconnection line, and
   the top surface of the through electrode has an uneven shape.

8. The semiconductor device of claim 4, wherein the through electrode extends beyond the electrically active surface of the substrate to fill a space between the first via and the second via.

9. The semiconductor device of claim 1, further comprising a third via that is provided outside the first via and is electrically connected to the interconnection line.

10. The semiconductor device of claim 9, wherein the third via is a ring-shaped structure that is between the substrate and the interconnection line and encloses the first via.

11. The semiconductor device of claim 9, wherein the third via is a circular-pillar-shaped structure that is between the substrate and the interconnection line.

12. A semiconductor device, comprising:
a semiconductor substrate having electrically active and electrically inactive surfaces facing each other;
an interlayered insulating layer provided on the electrically active surface of the semiconductor substrate,
a metal line provided in the interlayered insulating layer;
a via hole vertically penetrating the semiconductor substrate from the electrically active surface to the electrically inactive surface;
a through electrode filling the via hole and vertically extending from the electrically active surface to the electrically inactive surface; and
a main via provided in the interlayered insulating layer that electrically connects the through electrode to the metal line,
wherein the main via has a hollow ring-shaped cylindrical structure that vertically extends from the metal line to the through electrode and at least a portion of the main via is along a circumference of the via hole and overlaps at least a portion of the via hole, when viewed in a plan view.

13. The semiconductor device of claim 12, further comprising an auxiliary via that is provided in an empty space of the main via or outside the main via and is electrically connected to the metal line.

14. The semiconductor device of claim 13, wherein the through electrode extends into a region between the auxiliary via and the main via and extends beyond the electrically active surface of the semiconductor substrate.

15. The semiconductor device of claim 12, wherein the through electrode extends into the main via beyond the electrically active surface of the semiconductor substrate.

16. A semiconductor device comprising:
a substrate having electrically active and electrically inactive surfaces that face each other;
a through electrode that vertically extends through the substrate from the electrically active surface to the electrically inactive surface and, in a horizontal plane, the through electrode has a first perimeter; and
a first via on the electrically active surface of the substrate, the first via having an inner perimeter and an outer perimeter in the horizontal plane,
wherein the outer perimeter of the first via is greater than and surrounds the first perimeter of the through electrode.

17. The semiconductor device of claim 16, wherein the inner perimeter of the first via is greater than or equal to the first perimeter of the through electrode and optionally the inner perimeter of the first via surrounds the first perimeter of the through electrode.

18. The semiconductor device of claim 16, wherein the substrate includes an inner surface that vertically extends through the substrate from the electrically active surface to the electrically inactive surface, and the inner surface, in the horizontal plane, has a second perimeter, and
wherein the outer perimeter of the first via is greater than and surrounds the second perimeter, the inner perimeter of the first via is less than the second perimeter, and the second perimeter surrounds the inner perimeter.

19. The semiconductor device of claim 16, wherein the first via has a hollow cylindrical shape.

20. The semiconductor device of claim 16, further comprising a second via on the electrically active surface of the substrate and in an area surrounded by the outer and inner perimeters of the first via.

* * * * *